(12) United States Patent
Hasegawa

(10) Patent No.: US 11,127,527 B2
(45) Date of Patent: Sep. 21, 2021

(54) METHOD FOR MANUFACTURING INDUCTOR

(71) Applicant: Murata Manufacturing Co., Ltd., Kyoto-fu (JP)

(72) Inventor: Shin Hasegawa, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 372 days.

(21) Appl. No.: 15/956,643

(22) Filed: Apr. 18, 2018

(65) Prior Publication Data

US 2018/0308625 A1   Oct. 25, 2018

(30) Foreign Application Priority Data

Apr. 20, 2017   (JP) .............................. JP2017-083859

(51) Int. Cl.
*H01F 7/06*   (2006.01)
*H01F 27/29*   (2006.01)
(Continued)

(52) U.S. Cl.
CPC ........... *H01F 27/292* (2013.01); *H01F 17/06* (2013.01); *H01F 27/022* (2013.01); *H01F 27/26* (2013.01);
(Continued)

(58) Field of Classification Search
CPC .... H01F 27/022; H01F 27/26; H01F 27/2823; H01F 27/2828; H01F 27/292;
(Continued)

(56) References Cited

U.S. PATENT DOCUMENTS 4,513,274 A * 4/1985 Halder ................. G01R 15/185
336/173
9,691,541 B2 * 6/2017 Tanaka ..................... H01F 27/33
(Continued)

FOREIGN PATENT DOCUMENTS

CN   106165034 A   11/2016
JP   H05-90035 A   4/1993
(Continued)

OTHER PUBLICATIONS

An Office Action; "Notice of Reasons for Refusal," dated by the Japanese Patent Office on Jun. 11, 2019, which corresponds to Japanese Patent Application No. 2017-083859 and is related to U.S. Appl. No. 15/956,643; with English language translation.
An Office Action dated by the China National Intellectual Property Administration on May 21, 2020, which corresponds o Chinese Patent Application No. 201810348722.4 and is related to U.S. Appl. No. 15/956,643 with English language translation.

*Primary Examiner* — Paul D Kim
(74) *Attorney, Agent, or Firm* — Studebaker & Brackett PC

(57) ABSTRACT

An inductor includes an annular core, and a first coil and a second coil which are wound around the core. The core has an internal surface, an external surface, a first end surface, and a second end surface. The first coil and the second coil include a first coil piece having a length of one turn and a second coil piece having a length of one turn. The first coil piece and the second coil piece surround the internal surface, the first end surface, the external surface, and the second end surface of the core. The first coil piece has, at its tip, a joint portion to be joined to the second coil piece, and the second coil piece has, at its tip, a joint surface to be in contact with the joint portion. Thus, the resistance value of the coil is reduced.

15 Claims, 24 Drawing Sheets

(51) Int. Cl.
  *H01F 27/28* (2006.01)
  *H01L 49/02* (2006.01)
  *H01F 27/02* (2006.01)
  *H01F 27/26* (2006.01)
  *H01F 27/30* (2006.01)
  *H01F 17/06* (2006.01)

(52) U.S. Cl.
  CPC ..... *H01F 27/2823* (2013.01); *H01F 27/2828* (2013.01); *H01F 27/303* (2013.01); *H01F 27/306* (2013.01); *H01L 28/10* (2013.01)

(58) Field of Classification Search
  CPC ...... H01F 27/303; H01F 27/306; H01F 17/06; H01L 28/10
  See application file for complete search history.

(56) References Cited

U.S. PATENT DOCUMENTS

| | | | |
|---|---|---|---|
| 2016/0181007 A1 | 6/2016 | Shiokawa et al. | |
| 2017/0018350 A1 | 1/2017 | Blakborn | |
| 2019/0027297 A1* | 1/2019 | Sasaki | H01F 27/292 |

FOREIGN PATENT DOCUMENTS

| | | |
|---|---|---|
| JP | 2004-087854 A | 3/2004 |
| JP | 2014-057044 A | 3/2014 |
| JP | 2016-187031 A | 10/2016 |
| JP | 2017-510996 A | 4/2017 |

* cited by examiner

METHOD FOR MANUFACTURING INDUCTOR

CROSS-REFERENCE TO RELATED APPLICATION

This application claims benefit of priority to Japanese Patent Application No. 2017-083859, filed Apr. 20, 2017, the entire content of which is incorporated herein by reference.

BACKGROUND

Technical Field

The present disclosure relates to an inductor and a method for manufacturing an inductor.

Background Art

An inductor having an annular magnetic core and a coil wound around the magnetic core has been known. In Japanese Patent Application Laid-Open No. 2014-57044, for example, there has been suggested, as a coil for an inductor of this type, a coil having a plurality of coil pieces of less than one turn and a substrate for electrically connecting coil pieces which are adjacent to each other in the circumferential direction of the magnetic core, from among the plurality of coil pieces.

SUMMARY

Meanwhile, in a case where a coil of one turn is formed by using a coil formed by joining a plurality of coil pieces and a substrate to each other as described above, one connection portion other than connection portions at both ends of the coil with another coil of one turn is formed. Such a connection portion increases a resistance value of the coil.

The present disclosure provides an inductor capable of reducing the resistance value of the coil, and a method for manufacturing the inductor.

According to a method for manufacturing an inductor, the inductor includes an annular magnetic core and a coil wound around the magnetic core. The magnetic core has an internal surface, an external surface, a first end surface connecting the internal surface and the external surface, and a second end surface connecting the internal surface and the external surface and facing the first end surface. The method includes disposing a first coil piece and a second coil piece around the magnetic core. The first coil piece and the second coil piece have a length of one turn wound around the magnetic core and a shape capable of covering the internal surface, the external surface, and the first end surface of the magnetic core. The method also includes bending the second coil piece to cover the second end surface by a projecting portion of the second coil piece so as to allow a joint surface of the second coil piece to be in contact with a joint portion of the first coil piece. The projecting portion projects beyond the second end surface of the magnetic core along a center axis of the magnetic core. The method further includes forming at least a portion of the coil by joining the joint surface of the second coil piece and the joint portion of the first coil piece.

According to this configuration, in the bending, the projecting portion of the second coil piece is bent to cover the second end surface of the magnetic core, whereby the second coil piece is continuously wound around the magnetic core along the internal surface, the first end surface, the external surface, and the second end surface. Thus, a connection portion other than connection portions at both ends of each coil of one turn is not formed. Accordingly, the number of connection portions can be decreased, whereby the resistance value of the coil can be reduced.

In the method for manufacturing an inductor described above, it is preferable that, in the forming, the joint surface of the second coil piece and the joint portion of the first coil piece are joined by a weld section formed by melting the joint surface and the joint portion. According to this configuration, the weld section is formed from a metal material same as the material of the first coil piece and the material of the second coil piece, respectively, whereby an interface which is likely to occur in joining dissimilar metals is hardly caused between the weld section and the first coil piece and between the weld section and the second coil piece. Accordingly, the resistance value of the coil can be reduced, as compared to a configuration where the first coil piece and the second coil piece are joined by means of a joint material such as a solder, for example.

In the method for manufacturing an inductor described above, it is preferable that, in the bending, the joint surface of the second coil piece is brought into contact with the joint portion of the first coil piece by bending the projecting portion of the second coil piece toward the joint portion of the first coil piece. According to this configuration, the joint surface of the second coil piece is brought into contact with the joint portion of the first coil piece by bending one projecting portion of the second coil piece such that the projecting portion covers the second end surface of the magnetic core. That is, the coil of one turn can be formed by bending the projecting portion of the second coil piece only once. Thus, the number of times of bending the first coil piece and the second coil piece is reduced, as compared to a configuration in which the joint surface of the second coil piece is brought into contact with the joint portion of the first coil piece by bending the second coil piece such that the second coil piece covers the second end surface of the magnetic core and by bending the joint portion, which projects beyond the second end surface, of the first coil piece toward the projecting portion. Accordingly, the coil can easily be formed.

In the method for manufacturing an inductor described above, it is preferable that, in the bending, the joint surface of the second coil piece is brought into contact with a side surface of the joint portion of the first coil piece by fitting the tip of the projecting portion of the second coil piece to the joint portion of the first coil piece. According to this configuration, the projecting portion of the second coil piece and the joint portion of the first coil piece are fitted to each other, which can suppress a shift of the contact position between the joint surface of the second coil piece and the joint portion of the first coil piece due to springback which is caused when the projecting portion of the second coil piece is bent.

In the method for manufacturing an inductor described above, it is preferable that a coil piece in which an area of the joint surface is larger than an average sectional area of the second coil piece is used as the second coil piece. According to this configuration, the area of the joint surface of the second coil piece is larger than the average sectional area of the second coil piece, and accordingly, the contact area between a side surface of the joint portion of the first coil piece and the joint surface of the second coil piece can be increased by a commensurate amount. Thus, the resistance value at the joint section between the first coil piece and the second coil piece can be reduced. Note that, in the present specification, an average sectional area is a value obtained by dividing the volume of a member by a current path (length). The current path (length) means herein a path (length) passing through the center axis of the member.

In the method for manufacturing an inductor described above, it is preferable that a coil piece having a step portion formed at the joint portion is used as the first coil piece, and in the bending, the projecting portion of the second coil piece is bent and fitted to the joint portion of the first coil piece such that the projecting portion of the second coil piece is in contact with the step portion of the first coil piece. According to this configuration, the projecting portion of the second coil piece is fitted to the joint portion of the first coil piece with the projecting portion being positioned with respect to the first coil piece by the step portion, whereby positional misalignment in joining the projecting portion of the second coil piece and the joint portion of the first coil piece can be suppressed.

In the method for manufacturing an inductor described above, it is preferable that a coil piece in which the joint portion is cylindrical is used as the first coil piece, and a coil piece in which the joint surface is a recessed cylindrical surface provided at the tip of the projecting portion of the second coil piece and fitted to the joint portion of the first coil piece is used as the second coil piece. According to this configuration, even if an angle formed by the projecting portion of the second coil piece and the joint portion of the first coil piece is changed, that is, even if the position of the projecting portion of the second coil piece about an axis of the joint portion of the first coil piece is changed, the contact area between the side surface of the joint portion of the first coil piece and the joint surface of the second coil piece is unchanged, and if changed, an amount of change is very small. Therefore, a degree of freedom in disposing the first coil piece and the second coil piece is increased. Thus, even if a positional relation between the joint portion of the first coil piece and the projecting portion of the second coil piece fitted to the joint portion varies, a reduction in the contact area caused by such a variation can be suppressed, and an increase in a resistance value at the joint section between the joint surface of the second coil piece and the joint portion of the first coil piece can also be suppressed.

In the method for manufacturing an inductor described above, it is preferable that, in the bending, an insulating material having electrical insulating properties is attached to the magnetic core, and the insulating material is sandwiched between the projecting portion of the second coil piece and the magnetic core by bending the projecting portion of the second coil piece. According to this configuration, the projecting portion of the second coil piece presses the insulating material when being bent. In other words, when being bent, the projecting portion of the second coil piece does not directly press the magnetic core. Therefore, damage to the magnetic core caused by the projecting portion of the second coil piece pressing the magnetic core can be suppressed.

In the method for manufacturing an inductor described above, it is preferable that, in the bending, a support jig for supporting the projecting portion of the second coil piece is attached to the magnetic core, and the support jig sandwiched between the projecting portion of the second coil piece and the magnetic core is pulled out after the projecting portion of the second coil piece is bent. According to this configuration, the projecting portion of the second coil piece presses the support jig when being bent. In other words, when being bent, the projecting portion of the second coil piece does not directly press the magnetic core. Therefore, damage to the magnetic core caused by the projecting portion of the second coil piece pressing the magnetic core can be suppressed. In addition, due to the support jig being pulled out, an increase in the weight of the inductor can be suppressed.

In the method for manufacturing an inductor described above, it is preferable that, in the disposing of the first coil piece and the second coil piece around the magnetic core, the projecting portion of the second coil piece is disposed on a side near the external surface of the magnetic core, and the joint portion of the first coil piece is disposed on a side near the internal surface of the magnetic core. Also, in the bending, the projecting portion of the second coil piece is bent toward the internal surface to bring the joint surface of the second coil piece to be in contact with the joint portion of the first coil piece. According to this configuration, the projecting portion of the second coil piece is bent from the outside of the magnetic core toward the inside thereof, whereby a bending tool (an upper die if the projecting portion is bent by a pressing machine) for bending the projecting portion is disposed outside of the magnetic core. Therefore, the bending tool or the like is easy to be disposed, as compared to a configuration in which the bending tool or the like is disposed inside of the magnetic core, whereby the projecting portion is easily bent. Accordingly, the coil can easily be formed.

In the method for manufacturing an inductor described above, it is preferable that, in the disposing of the first coil piece and the second coil piece around the magnetic core, the projecting portion of the second coil piece is disposed on a side near the internal surface of the magnetic core, and the joint portion of the first coil piece is disposed on a side near the external surface of the magnetic core. Also, in the bending, the projecting portion of the second coil piece is bent toward the external surface to bring the joint surface of the second coil piece to be in contact with the joint portion of the first coil piece. According to this configuration, a space around the external surface of the magnetic core is larger than a space around the internal surface thereof in the circumferential direction of the magnetic core, whereby, in a multi-turn coil, that is, in a case where a plurality of joint surfaces and a plurality of joint portions are arranged in the circumferential direction of the magnetic core, for example, an insulation distance between the circumferentially adjacent joint surfaces and an insulation distance between the circumferentially adjacent joint portions can be increased.

The present disclosure further provides an inductor including an annular magnetic core, and a coil wound around the magnetic core. The magnetic core has an internal surface, an external surface, a first end surface connecting the internal surface and the external surface, and a second end surface connecting the internal surface and the external surface and facing the first end surface. The coil includes a first coil piece having a length of one turn and a second coil piece having a length of one turn. The first coil piece and the second coil piece surround the internal surface, the first end surface, the external surface, and the second end surface of the magnetic core. Also, one of the first coil piece and the second coil piece has, at a tip thereof, a joint portion to be joined to the other of the first coil piece and the second coil piece, and the other of the first coil piece and the second coil piece has, at a tip thereof, a joint surface to be in contact with the joint portion.

According to this configuration, the first coil piece and the second coil piece are continuously wound around the magnetic core along the internal surface, the first end surface, the external surface, and the second end surface, whereby a connection portion is not formed except for both ends of a coil of one turn. Accordingly, the number of joint portions can be decreased, whereby the resistance value of the coil can be reduced.

It is preferable that, in the inductor, the first coil piece and the second coil piece are joined by a weld section between a side surface of the joint portion and the joint surface. According to this configuration, the weld section is formed from a metal material same as the material of the first coil piece and the material of the second coil piece, respectively, whereby an interface which is likely to occur in joining dissimilar metals is hardly caused between the weld section and the first coil piece and between the weld section and the second coil piece. Accordingly, the resistance value of the coil can be reduced, as compared to a configuration where the first coil piece and the second coil piece are joined by means of a joint material such as a solder, for example.

It is preferable that, in the inductor, an area of the joint surface of the other of the first coil piece and the second coil piece is larger than an average sectional area of the other of the first coil piece and the second coil piece. According to this configuration, the area of the joint surface of the first coil piece is larger than the average sectional area of the first coil piece, and accordingly, the contact area between the side surface of the joint portion of the second coil piece and the joint surface of the first coil piece can be increased by a commensurate amount. Thus, the resistance value at the joint section between the first coil piece and the second coil piece can be reduced.

It is preferable that, in the inductor, the joint portion of the one of the first coil piece and the second coil piece is cylindrical, and the joint surface of the other of the first coil piece and the second coil piece is a recessed cylindrical surface which is provided at the tip of the other of the first coil piece and the second coil piece and is fitted to the joint portion of the one of the first coil piece and the second coil piece. According to this configuration, even if an angle formed by the joint portion of the one of the first coil piece and the second coil piece and the joint surface of the other is changed, that is, even if the position of the other of the first coil piece and the second coil piece about an axis of the joint portion is changed, the contact area between the side surface of the joint portion and the joint surface is unchanged, and if changed, an amount of change is very small. Therefore, a degree of freedom in disposing the first coil piece and the second coil piece is increased. Thus, even if a positional relation between the joint portion of the one of the first coil piece and the second coil piece and the projecting portion of the other fitted to the joint portion varies, a reduction in the contact area caused by such a variation can be suppressed, and an increase in a resistance value at the joint section between the joint surface and the joint portion can also be suppressed.

It is preferable that, in the inductor, the joint portion and the joint surface are located on a side near the second end surface and on a side near the internal surface or on a side near the external surface of the magnetic core. The inductor further includes an insulating material which has electrical insulating properties and is interposed between the second end surface of the magnetic core and a portion of the other of the first coil piece and the second coil piece, the portion covering the second end surface. The insulating material covers an end of the second end surface opposite to an end which is on the side near the internal surface or on the side near the external surface of the magnetic core and at which the joint portion and the joint surface are located. According to this configuration, the contact of the other of the first coil piece and the second coil piece with the magnetic core can be suppressed, because the other of the first coil piece and the second coil piece is in contact with the insulating material. Thus, due to the insulating material, the other of the first coil piece and the second coil piece can be prevented from directly pressing the magnetic core.

It is preferable that, in the inductor, the joint portion and the joint surface are located inside of the internal surface of the magnetic core. According to this configuration, a bending tool (an upper die if the first coil piece and the second coil piece are bent by a pressing machine) for bending the first coil piece and the second coil piece from the external surface of the magnetic core to cover the second end surface is disposed outside of the magnetic core. Therefore, the bending tool or the like is easy to be disposed, as compared to a configuration in which the bending tool or the like is disposed inside of the magnetic core, whereby the projecting portion is easily bent. Accordingly, the coil can easily be formed.

It is preferable that, in the inductor, the joint portion and the joint surface are located outside of the external surface of the magnetic core. According to this configuration, a space around the external surface of the magnetic core is larger than a space around the internal surface thereof, whereby, in a multi-turn coil, that is, in a case where a plurality of joint surfaces and a plurality of joint portions are arranged in the circumferential direction of the magnetic core, for example, an insulation distance between the circumferentially adjacent joint surfaces and an insulation distance between the circumferentially adjacent joint portions can be increased.

According to the inductor and the method for manufacturing an inductor in the present disclosure, a resistance value of a coil can be reduced.

DETAILED DESCRIPTION

Embodiments of an inductor and a method for manufacturing the inductor will be described below with reference to the drawings. Note that the accompanying drawings may illustrate components as enlarged for facilitating understanding. In addition, the dimensional proportion of components may not reflect the actual one or may differ from those in the other drawings.

First Embodiment

A first embodiment of an inductor and a method for manufacturing the inductor will be described below with reference to FIGS. 1 to 14.

Figure 1:
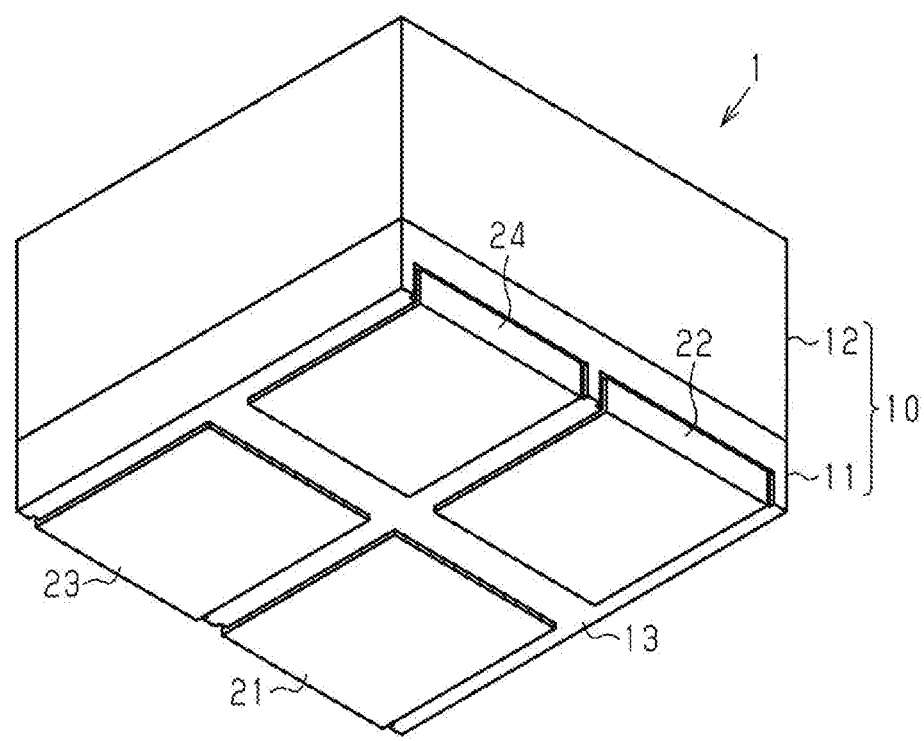
FIG. 1 is a perspective view illustrating an inductor according to a first embodiment.
Figure 2:
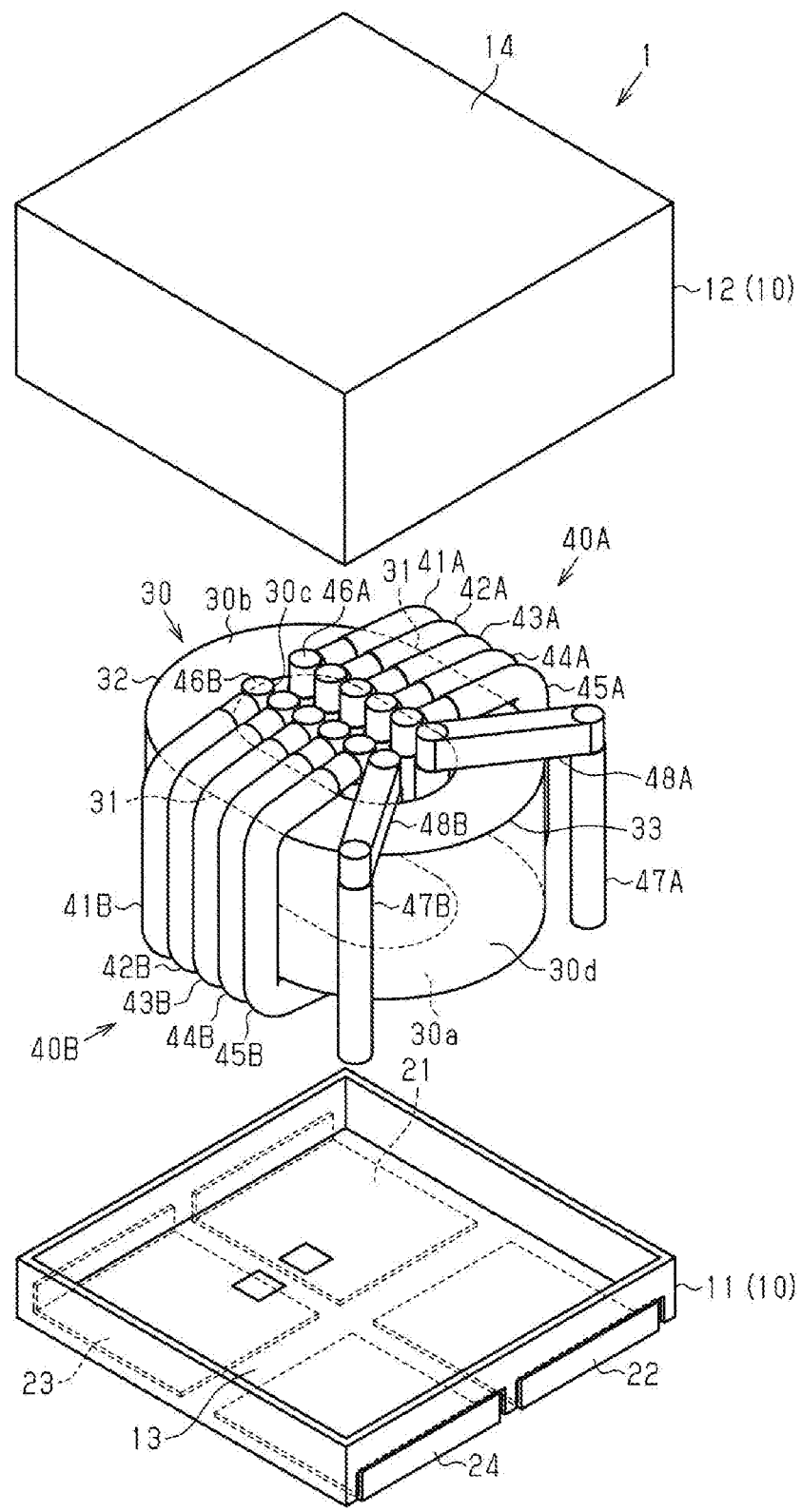
FIG. 2 is an exploded perspective view illustrating the inductor according to the first embodiment.

As illustrated in FIGS. 1 and 2, an inductor 1 includes: a case 10 having a rectangular solid shape; a core 30, a first coil 40A, and a second coil 40B which are housed in the case 10; and first to fourth electrode terminals 21 to 24 mounted to the case 10. The case 10 has a first case 11 to which the first to fourth electrode terminals 21 to 24 are mounted and a second case 12 attached to the first case 11. The case 10 is formed from a resin such as a polyphenylene sulfide resin or ceramics.

The first to fourth electrode terminals 21 to 24 are mounted on a lower surface of a bottom portion 13 of the first case 11. The first to fourth electrode terminals 21 to 24 are formed from a metal plate material and bent toward the side surface from the lower surface of the bottom portion 13. The first to fourth electrode terminals 21 to 24 are disposed at four corners of the bottom portion 13.

As illustrated in FIG. 2, the core 30 is an annular magnetic core. More specifically, the core 30 has, in a plan view, an oblong shape with a pair of straight portions 31, a first curved portion 32 connecting one ends of the pair of straight portions 31, and a second curved portion 33 connecting the other ends of the pair of straight portions 31. The cross-sectional shape obtained by cutting the core 30 along a plane perpendicular to the circumferential direction is rectangle. As illustrated in FIG. 2, the core 30 has a first end surface 30a on one side and a second end surface 30b on the other side in the axial direction. The core 30 also has an internal surface 30c and an external surface 30d. The first end surface 30a and the second end surface 30b connect the internal surface 30c and the external surface 30d. The first end surface 30a faces the bottom portion 13 of the first case 11. The second end surface 30b faces the first end surface 30a and a top plate 14 of the second case 12.

The core 30 is formed from a metal material or a metal magnetic body such as a soft ferrite or iron. If a metal material is used, it is preferable that an insulating coating film is formed on the surface of the core 30 by attaching an insulation sheet or applying an insulating material, for example.

The first coil 40A and the second coil 40B are wound around the core 30. The first coil 40A includes first to fifth coil pieces 41A to 45A, a first electrode member 46A, a second electrode member 47A, and a connection piece 48A. The second coil 40B includes first to fifth coil pieces 41B to 45B, a first electrode member 46B, a second electrode member 47B, and a connection piece 48B. The first to fifth coil pieces 41A to 45A and 41B to 45B have a circular cross section. The first to fifth coil pieces 41A to 45A and 41B to 45B have the same wire diameter. The wire diameter of each of the first to fifth coil pieces 41A to 45A and 41B to 45B is 2 mm, for example. It is to be noted that the wire diameter of each of the first to fifth coil pieces 41A to 45A and 41B to 45B can be changed as appropriate, and it may be less than 2 mm, for example, 1 mm.

The electrode members 46A, 46B, 47A, and 47B have a columnar shape, and are provided to erect at the bottom portion 13 of the first case 11. Each of the electrode members 46A, 46B, 47A, and 47B is embedded in the bottom portion 13 of the first case 11 such that a portion of the lower end thereof is in contact with the corresponding one of the first to fourth electrode terminals 21 to 24. The first electrode member 46A is electrically connected to the first electrode terminal 21. The second electrode member 47A is electrically connected to the second electrode terminal 22. Thus, the first coil 40A is electrically connected to the first electrode terminal 21 and the second electrode terminal 22. The first electrode member 46B is electrically connected to the third electrode terminal 23. The second electrode member 47B is electrically connected to the fourth electrode terminal 24. Thus, the second coil 40B is electrically connected to the third electrode terminal 23 and the fourth electrode terminal 24. The electrode members 46A, 46B, 47A, and 47B are electrically connected to the first to fourth electrode terminals 21 to 24, respectively, by a mechanical method such as crimping or by means of a joint material. The respective electrode members 46A, 46B, 47A, and 47B have a wire diameter equal to the wire diameter of the first to fifth coil pieces 41A to 45A and 41B to 45B.

Each of the connection pieces 48A and 48B has a square pole shape. The connection pieces 48A and 48B extend to cover the second end surface 30b of the core 30. The connection piece 48A connects the fifth coil piece 45A and the second electrode member 47A. The connection piece 48B connects the fifth coil piece 45B and the second electrode member 47B. The outer dimension, that is, the thickness (the length of one side of the cross section) of each of the connection pieces 48A and 48B is equal to the wire diameter of each of the first to fifth coil pieces 41A to 45A and 41B to 45B.

The wire diameter of the electrode members 46A, 46B, 47A, and 47B and the outer dimension of the connection pieces 48A and 48B can be changed as appropriate. For example, the wire diameter of at least one of the electrode members 46A, 46B, 47A, and 47B may be different from the wire diameter of the first to fifth coil pieces 41A to 45A and 41B to 45B. In addition, the outer dimension of at least one of the connection pieces 48A and 48B may be different from the wire diameter of the first to fifth coil pieces 41A to 45A and 41B to 45B, for example.

The winding direction of the first coil 40A around the core 30 and the winding direction of the second coil 40B around the core 30 are reverse to each other. In the present embodiment, the number of turns of the first coil 40A is the same as the number of turns of the second coil 40B. The number of turns of the first coil 40A and the number of turns of the second coil 40B are five. The first coil 40A and the second coil 40B are used as a primary coil, a secondary coil, or a common mode choke coil, for example. Note that the number of turns of the first coil 40A and the number of turns of the second coil 40B can be respectively changed, as appropriate. For example, the number of turns of the first coil 40A and the number of turns of the second coil 40B may be different from each other. Further, only one of the first coil 40A and the second coil 40B may be wound around the core 30, or three or more coils may be wound around the core 30.

The first to fifth coil pieces 41A to 45A and 41B to 45B, the first electrode members 46A and 46B, the second electrode members 47A and 47B, and the connection pieces 48A and 48B are formed from a conductive material such as pure copper (Cu). In addition, the first to fifth coil pieces 41A to 45A and 41B to 45B, the first electrode members 46A and 46B, the second electrode members 47A and 47B, and the connection pieces 48A and 48B are formed from the same metal material. It is to be noted that commonly used metals such as gold (Au), silver (Ag), or aluminum (Al) or a material plated with copper (Cu) or nickel (Ni) may be used for the first to fifth coil pieces 41A to 45A and 41B to 45B, the first electrode members 46A and 46B, the second electrode members 47A and 47B, and the connection pieces 48A and 48B. Preferably, a metal material having low resistivity may be used from among these metal materials.

The detailed configuration of the first coil 40A and the second coil 40B will be described.

Figure 3:
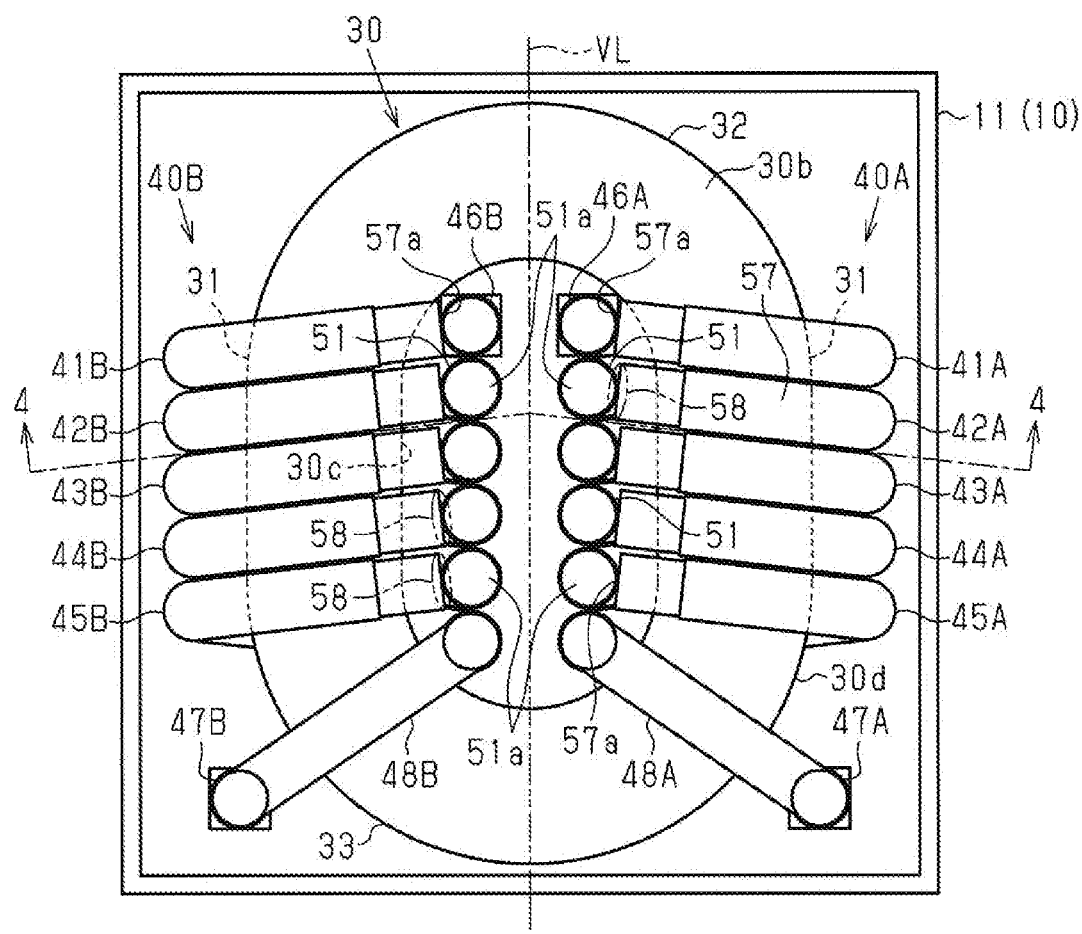
FIG. 3 is a schematic plan view illustrating the inductor according to the first embodiment.

As illustrated in FIGS. 2 and 3, the first to fifth coil pieces 41A to 45A of the first coil 40A are arranged at one of the pair of straight portions 31 of the core 30, and the first to fifth coil pieces 41B to 45B of the second coil 40B are arranged at the other of the pair of straight portions 31 of the core 30. The first to fifth coil pieces 41A to 45A and 41B to 45B are arranged in order along the circumferential direction of the core 30, that is, along the direction in which the straight portions 31 extend. The first to fifth coil pieces 41A to 45A and 41B to 45B have the same shape. As illustrated in FIG. 3, in a plan view, the first coil 40A and the second coil 40B have a line-symmetrical shape with respect to a virtual line VL which is a straight line connecting the center of the first curved portion 32 and the center of the second curved portion 33 of the core 30 in the direction in which the straight portions 31 extend.

The first to fifth coil pieces 41A to 45A and 41B to 45B have a length of one turn. The surfaces of the first to fifth coil pieces 41A to 45A and 41B to 45B are covered by an insulating film, whereas both ends of each of the first to fifth coil pieces 41A to 45A and 41B to 45B are not covered by the insulating film.

Figure 4:
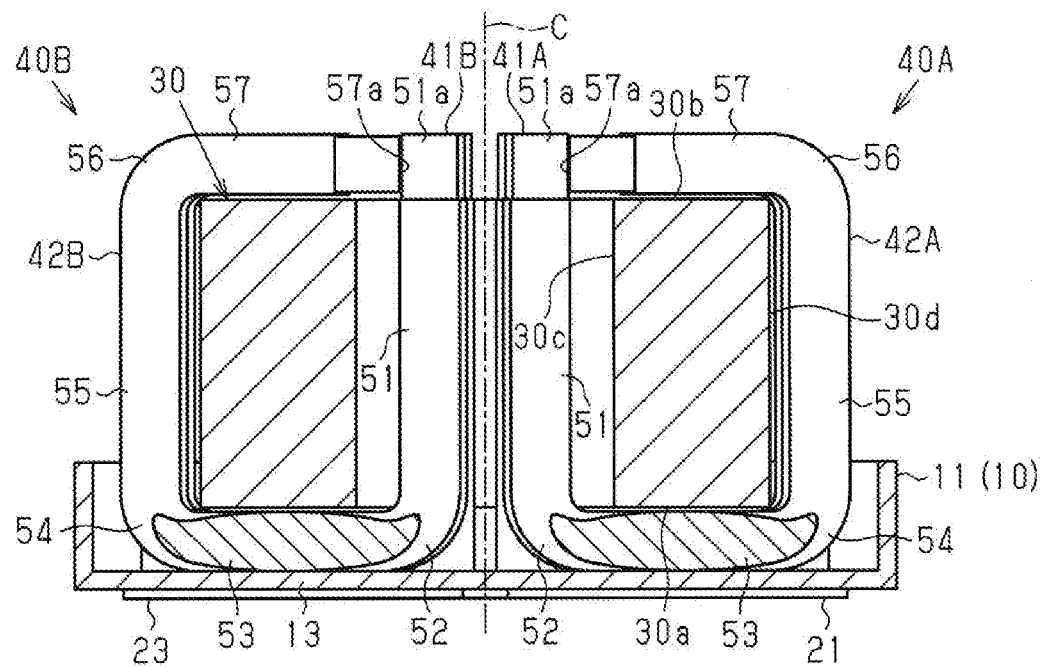
FIG. 4 is a schematic sectional view along a line 4-4 in FIG. 3.

As illustrated in FIGS. 3 and 4, the second coil piece 42A has an internal straight portion 51, a first curved portion 52, a first straight portion 53, a second curved portion 54, an external straight portion 55, a third curved portion 56, and a second straight portion 57. The internal straight portion 51 is inside the internal surface 30c of the core 30 and extends in the direction along a center axis C of the core 30. A joint portion 51a is formed at the tip of the internal straight portion 51, that is, at one end of the second coil piece 42A, the one end being not covered by the insulating film. At least a portion of the joint portion 51a projects from the second end surface 30b of the core 30. The first curved portion 52 is formed continuously from an end of the internal straight portion 51 near the first end surface 30a of the core 30 and is curved outward from this end. The first curved portion 52 covers a corner formed by the internal surface 30c and the first end surface 30a of the core 30 in a cross section (hereinafter referred to as a "cross section of the core 30") along a plane perpendicular to the circumferential direction of the core 30. The first straight portion 53 extends from the first curved portion 52 toward the external surface 30d of the core 30. The first straight portion 53 covers the first end surface 30a of the core 30. The second curved portion 54 is formed continuously from the end of the first straight portion 53 near the external surface 30d of the core 30 and is curved from this end toward the second end surface 30b of the core 30. The second curved portion 54 covers a corner formed by the first end surface 30a and the external surface 30d of the core 30 in the cross section of the core 30. The external straight portion 55 is outside the external surface 30d of the core 30 and extends in the direction along the center axis C. The third curved portion 56 is formed continuously from the end of the external straight portion 55 near the second end surface 30b of the core 30 and is curved inward from this end. The third curved portion 56 covers a corner formed by the external surface 30d and the second end surface 30b of the core 30 in the cross section of the core 30. The second straight portion 57 extends from the third curved portion 56 toward the internal surface 30c of the core 30 and a joint portion 51a of the first coil piece 41A. The second straight portion 57 covers the second end surface 30b of the core 30. The tip of the second straight portion 57 forms the other end, not covered by the insulating film, of the second coil piece 42A. A tip surface of the second straight portion 57 forms a joint surface 57a. The first coil pieces 41A and 41B, the second coil piece 42B, the third to fifth coil pieces 43A to 45A and 43B to 45B have the same configuration as the second coil piece 42A, and thus, the same components are identified by the same reference numerals, and the description thereof will be omitted.

Figure 5:
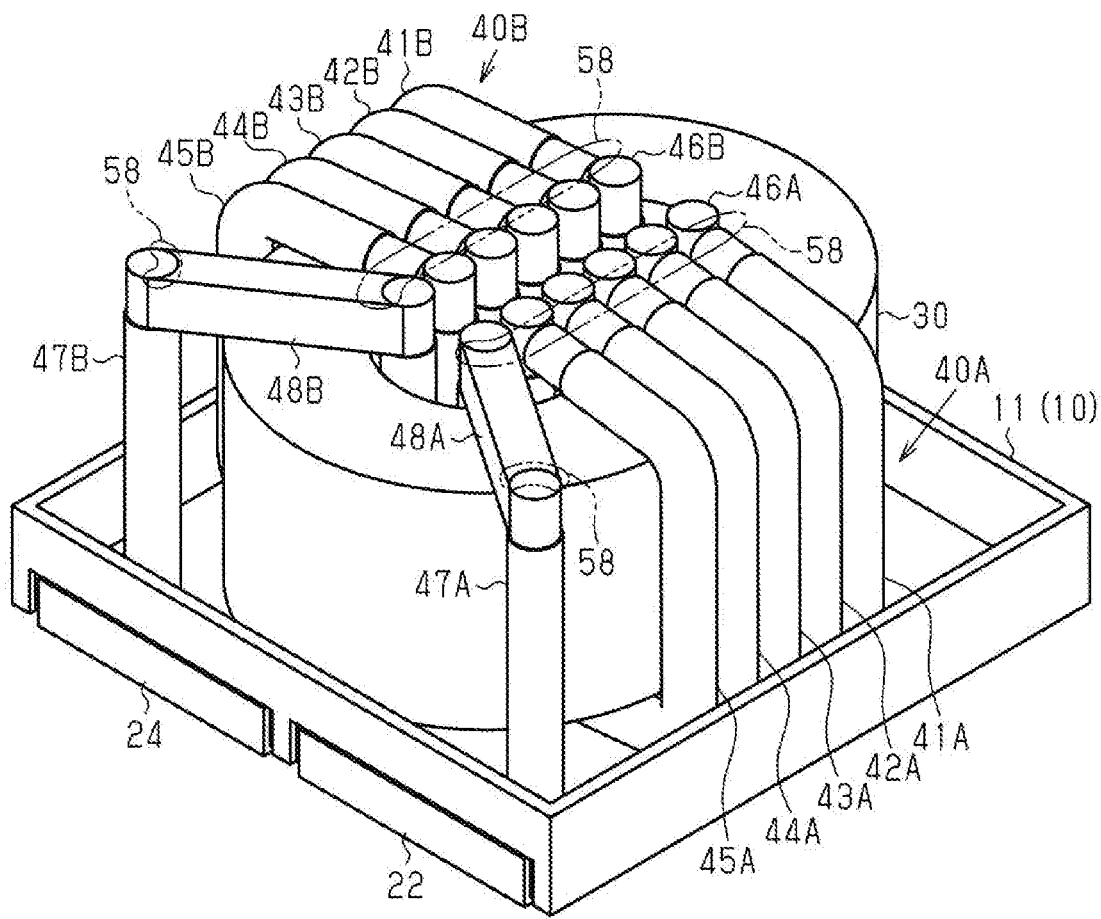
FIG. 5 is a perspective view of FIG. 3.

As illustrated in FIG. 3, the joint portions 51a of the first to fifth coil pieces 41A to 45A of the first coil 40A and the joint portions 51a of the first to fifth coil pieces 41B to 45B of the second coil 40B are arranged inside the core 30 in line along the direction in which the straight portions 31 extend. As illustrated in FIG. 5, the positions of the joint portions 51a of the first to fifth coil pieces 41A to 45A and 41B to 45B in the axial direction (direction along the center axis C) of the core 30 are the same. The second straight portions 57 of the first to fifth coil pieces 41A to 45A are parallel to one another, and the second straight portions 57 of the first to fifth coil pieces 41B to 45B are parallel to one another.

The first electrode member 46A is disposed at a position adjacent to the joint portion 51a of the first coil piece 41A on the opposite side of the joint portion 51a of the second coil piece 42A with respect to the joint portion 51a of the first coil piece 41A. The first electrode member 46B is disposed at a position adjacent to the joint portion 51a of the first coil piece 41B on the opposite side of the joint portion 51a of the second coil piece 42B with respect to the joint portion 51a of the first coil piece 41B. The second electrode member 47A is disposed outside the core 30 to be spaced from the fifth coil piece 45A in the circumferential direction of the core 30. The second electrode member 47B is disposed outside the core 30 to be spaced from the fifth coil piece 45B in the circumferential direction of the core 30.

The joint surface 57a of the first coil piece 41A is joined to the first electrode member 46A. The joint surface 57a of the second coil piece 42A is joined to the side surface of the joint portion 51a of the first coil piece 41A. The joint surface 57a of the third coil piece 43A is joined to the side surface of the joint portion 51a of the second coil piece 42A. The joint surface 57a of the fourth coil piece 44A is joined to the side surface of the joint portion 51a of the third coil piece 43A. The joint surface 57a of the fifth coil piece 45A is joined to the side surface of the joint portion 51a of the fourth coil piece 44A. One end of the connection piece 48A is joined to the joint portion 51a of the fifth coil piece 45A. The other end of the connection piece 48A is joined to the second electrode member 47A. Thus, the first coil 40A is formed. The second coil 40B is similarly formed by joining the first to fifth coil pieces 41B to 45B, the first electrode member 46B, the second electrode member 47B, and the connection piece 48B.

As illustrated in FIG. 5, the first to fifth coil pieces 41A to 45A, the first electrode member 46A, the second electrode member 47A, and the connection piece 48A are joined by welding. The first to fifth coil pieces 41B to 45B, the first electrode member 46B, the second electrode member 47B, and the connection piece 48B are also similarly joined by welding. The welding in the present embodiment does not mean welding using a joint material, such as brazing, but means a process for joining components by using only materials constituting the joint section without using a joint material. More specifically, in the present embodiment, a weld section 58 formed by melting the respective materials to be joined is formed at each joint section of the first to fifth coil pieces 41A to 45A, the first electrode member 46A, the second electrode member 47A, and the connection piece 48A.

The weld section 58 is formed by laser welding, for example. A YAG laser or a fiber laser is used for the laser welding, for example. The first to fifth coil pieces 41A to 45A, the first electrode member 46A, the second electrode member 47A, and the connection piece 48A are joined by partially melting each joint section by laser irradiation. In this way, each joint section includes only the materials of the members to be joined and does not include a joint material such as a solder. If the first to fifth coil pieces 41A to 45A, the first electrode member 46A, the second electrode member 47A, and the connection piece 48A are joined by using a joint material, two interfaces of substances made of different materials are formed between both members to be joined by the joint material. Thus, the resistance value of the first coil including the first to fifth coil pieces 41A to 45A, the first electrode member 46A, the second electrode member 47A, and the connection piece 48A as well as the joint material is increased due to the presence of such interfaces.

On the other hand, the first coil 40A according to the present embodiment includes the first to fifth coil pieces 41A to 45A, the first electrode member 46A, the second electrode member 47A, and the connection piece 48A, without including a joint material, as described above. Therefore, the resistance value of the first coil 40A is smaller than the first coil using the joint material. Regarding the second coil 40B, the same effect as the first coil 40A is obtained.

Figure 6:
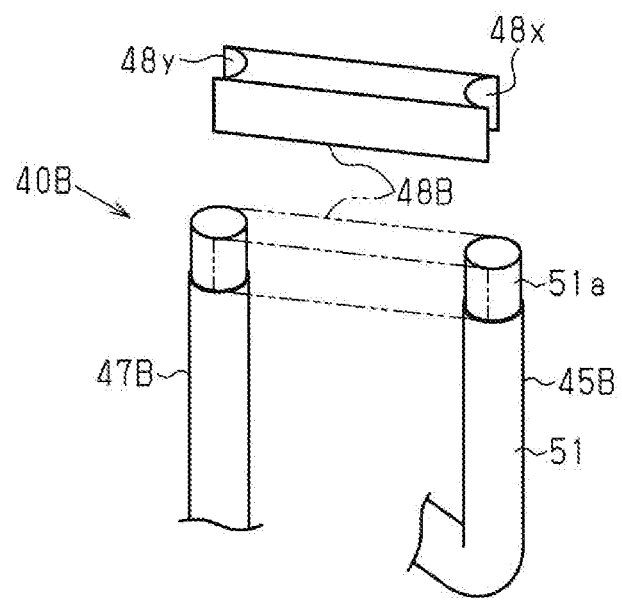
FIG. 6 is an exploded perspective view illustrating a portion of a second coil as enlarged.

As illustrated in FIG. 6, end surfaces 48x and 48y of the connection piece 48B of the second coil 40B are formed into shapes fitted to the side surface of the joint portion 51a of the fifth coil piece 45B and the side surface of the second electrode member 47B, respectively. Specifically, the end surface 48x of the connection piece 48B is formed into a shape conforming to the side surface of the joint portion 51a of the fifth coil piece 45B (a shape mating with the other surface when the respective surfaces are fitted to each other and in contact with each other). The end surface 48y of the connection piece 48B is formed into a shape conforming to the side surface of the second electrode member 47B. Specifically, the end surface 48x of the connection piece 48B is a recessed cylindrical surface mating with the side surface of the cylindrical joint portion 51a and having a curvature equal to the curvature of this side surface. The end surface 48y of the connection piece 48B is a recessed cylindrical surface mating with the side surface of the cylindrical second electrode member 47B and having a curvature equal to the curvature of this side surface. The length of the recessed cylindrical surface of the end surface 48x in the circumferential direction is equal to a half of the circumferential length of the side surface of the joint portion 51a of the fifth coil piece 45B, and the length of the recessed cylindrical surface of the end surface 48y in the circumferential direction is equal to a half of the circumferential length of the side surface of the second electrode member 47B.

Next, a method for manufacturing the inductor 1 will be described with reference to FIGS. 7 to 14.

Figure 7:
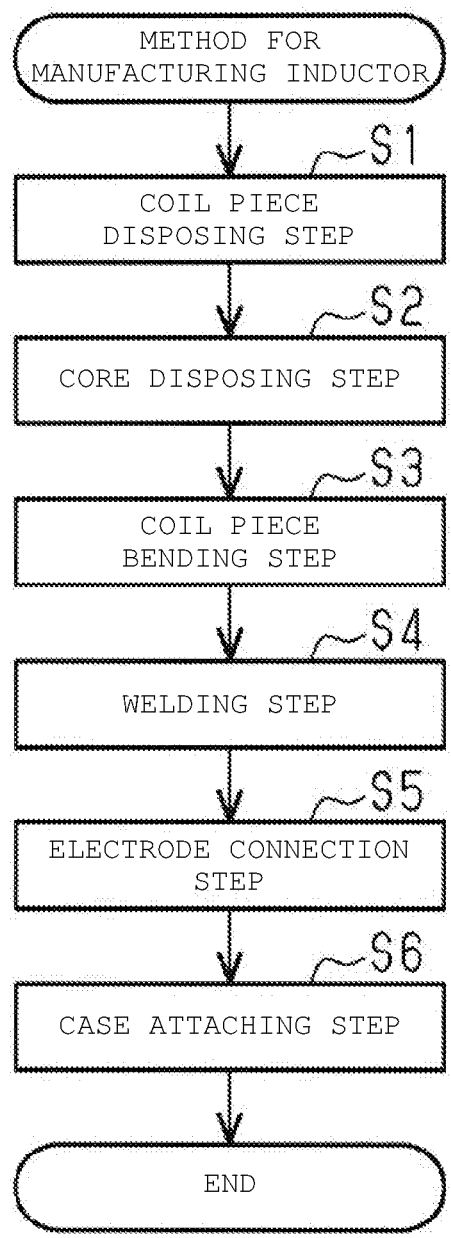
FIG. 7 is a flowchart illustrating a method for manufacturing the inductor.

As illustrated in FIG. 7, the method for manufacturing the inductor 1 includes a coil piece disposing step (step S1), a core disposing step (step S2), a coil piece bending step (step S3), a welding step (step S4), an electrode connection step (step S5), and a case attaching step (step S6). Herein, the coil piece disposing step and the core disposing step correspond to a "first step", the coil piece bending step corresponds to a "second step", and the welding step corresponds to a "third step".

Figure 8:
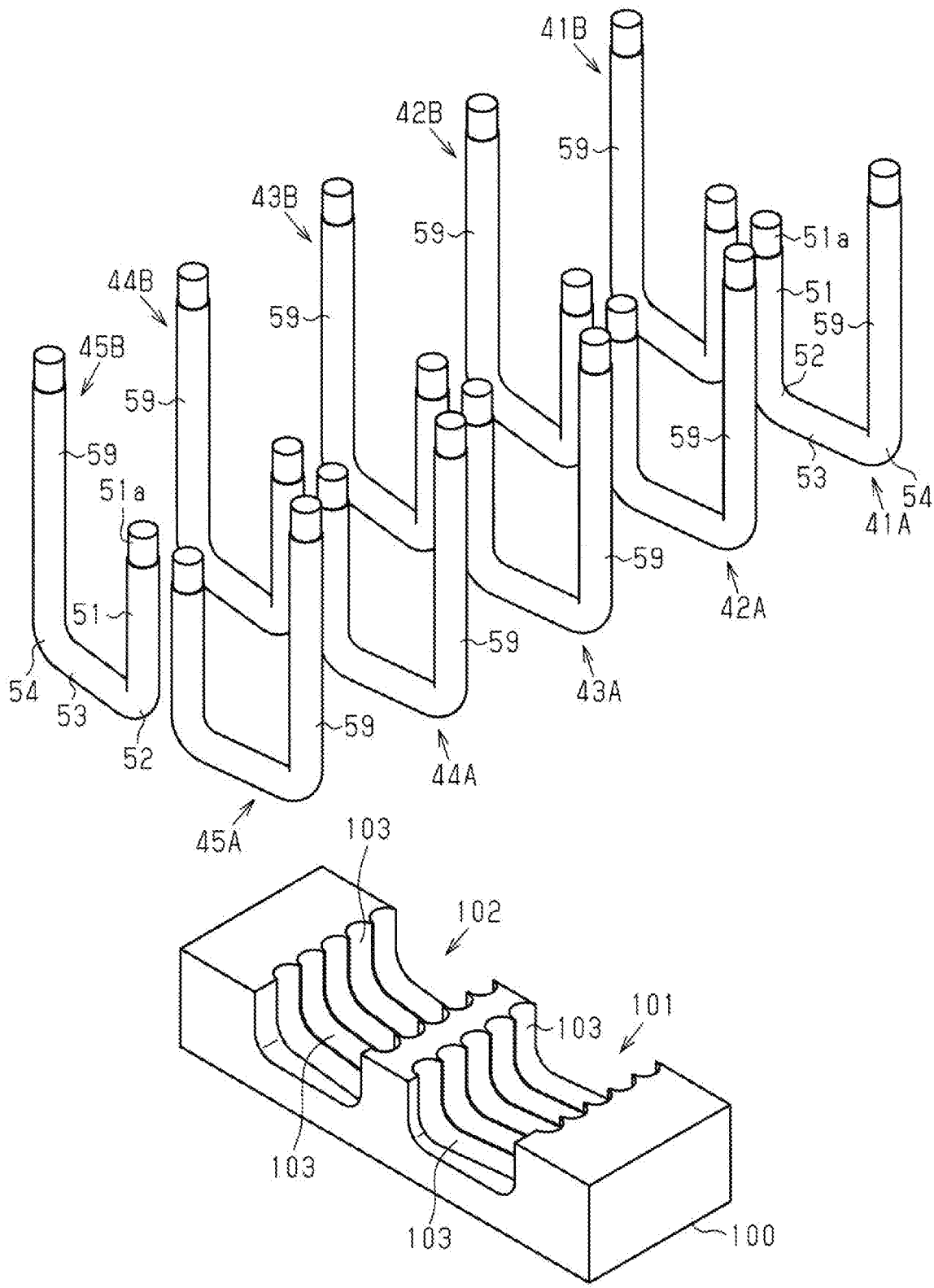
FIG. 8 is an explanatory view illustrating the method for manufacturing the inductor.

FIG. 8 illustrates the coil piece disposing step. As illustrated in FIG. 8, the first to fifth coil pieces 41A to 45A and 41B to 45B are mounted to a jig 100. The first to fifth coil pieces 41A to 45A are stored in a first storage section 101 of the jig 100, and the first to fifth coil pieces 41B to 45B are stored in a second storage section 102 of the jig 100. The first storage section 101 and the second storage section 102 are formed with a plurality of grooves 103 for aligning the first to fifth coil pieces 41A to 45A and 41B to 45B. Each groove 103 has a semicircular shape.

As illustrated in FIG. 8, each of the first to fifth coil pieces 41A to 45A and 41B to 45B are formed to have the internal straight portion 51, the first curved portion 52, the first straight portion 53, and the second curved portion 54 by bending a straight rod material having a circular cross section. On the other hand, the third curved portion 56 (see FIG. 4) is not formed on the first to fifth coil pieces 41A to 45A and 41B to 45B. In this way, the first to fifth coil pieces 41A to 45A and 41B to 45B are formed into a J shape. In the following description, a straight portion extending from the second curved portion 54 without having the third curved portion 56 is referred to as a "third straight portion 59". The third straight portion 59 has a length of a half turn.

The first storage section 101 supports the first to fifth coil pieces 41A to 45A so as to hold the internal straight portions 51 and the third straight portions 59. The first storage section 101 also supports the first curved portions 52, the first straight portions 53, and the second curved portions 54 of the first to fifth coil pieces 41A to 45A. Like the first storage section 101, the second storage section 102 supports the internal straight portions 51, the first curved portions 52, the first straight portions 53, the second curved portions 54, and the third straight portions 59 of the first to fifth coil pieces 41B to 45B. In this case, the respective grooves 103 are formed such that the internal straight portions 51 and the third straight portions 59 are shifted by a half of an arrangement pitch of the first to fifth coil pieces 41A to 45A and 41B to 45B in the arraying direction of the first to fifth coil pieces 41A to 45A and 41B to 45B. Herein, the arrangement pitch means a distance between the center of the joint portion of the coil piece and the center of the joint portion of the adjacent coil piece in the arraying direction of the coil pieces.

Figure 9:
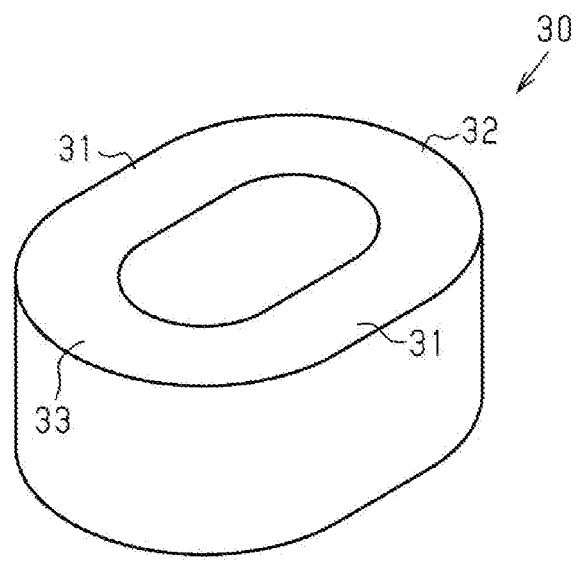
FIG. 9 is an explanatory view illustrating the method for manufacturing the inductor.
Figure 9:
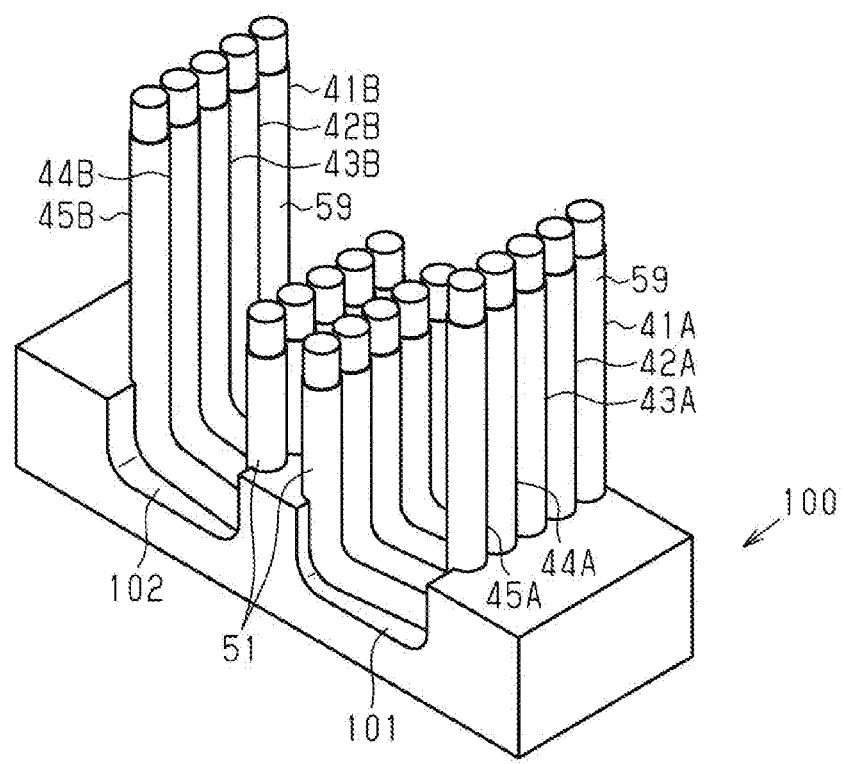
Figure 10A:
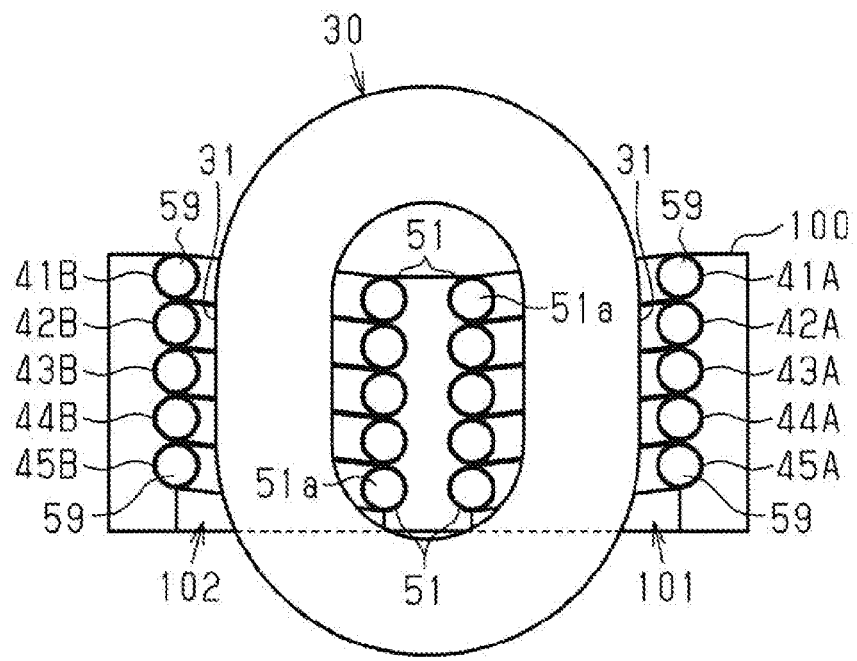
FIGS. 10A and 10B are explanatory views illustrating the method for manufacturing the inductor.
Figure 10B:
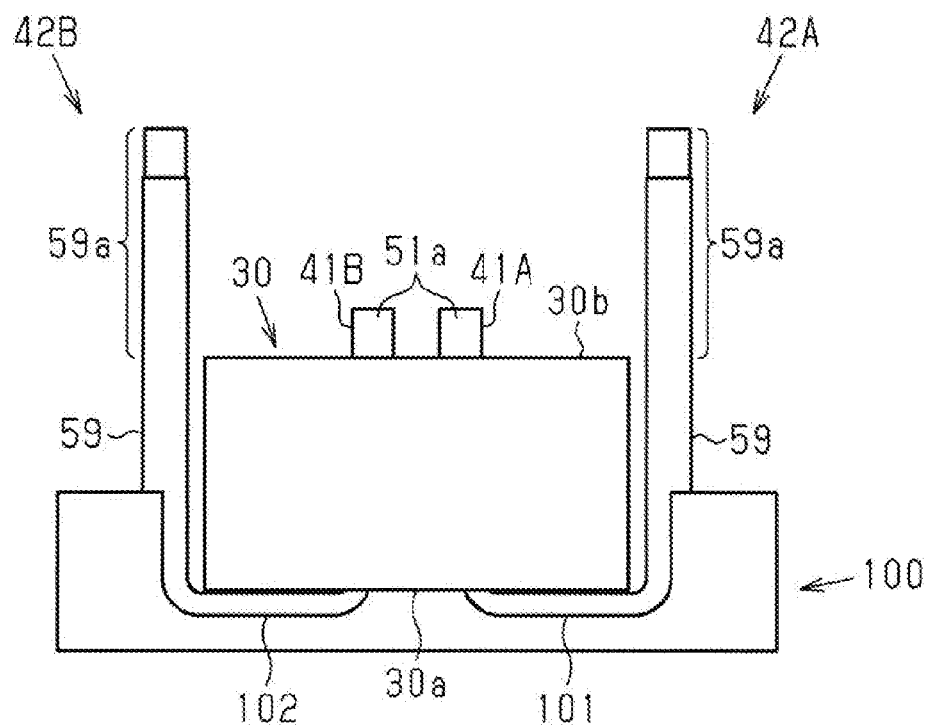

FIGS. 9, 10A and 10B illustrate the core disposing step. As illustrated in FIG. 9, the core 30 is inserted between the internal straight portions 51 and the third straight portions 59 of the first to fifth coil pieces 41A to 45A and 41B to 45B which are temporarily fixed to the first storage section 101 and the second storage section 102 of the jig 100. Thus, as illustrated in FIG. 10A, the internal straight portions 51 and the third straight portions 59 of the first to fifth coil pieces 41A to 45A and 41B to 45B are arrayed along a direction in which the straight portions 31 of the core 30 extend. As illustrated in FIG. 10B, the third straight portion 59 of each the second coil pieces 42A and 42B has a projecting portion 59a projecting beyond the second end surface 30b of the core 30. Each of the first coil pieces 41A and 41B and the third to fifth coil pieces 43A to 45A and 43B to 45B also has the projecting portion 59a as in the second coil pieces 42A and 42B.

Figure 11A:
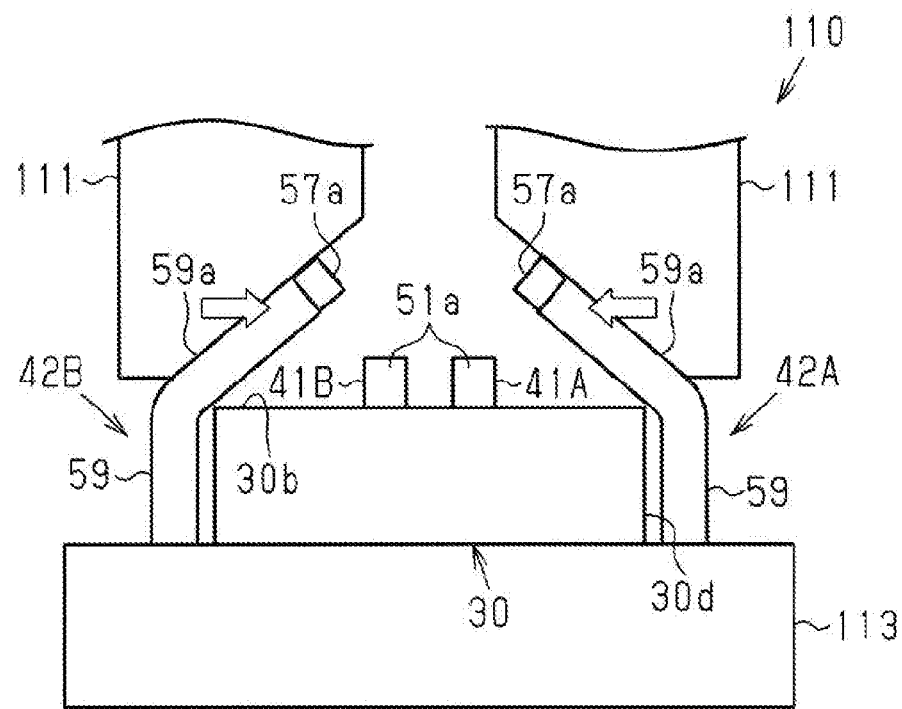
FIGS. 11A and 11B are explanatory views illustrating the method for manufacturing the inductor.
Figure 11B:
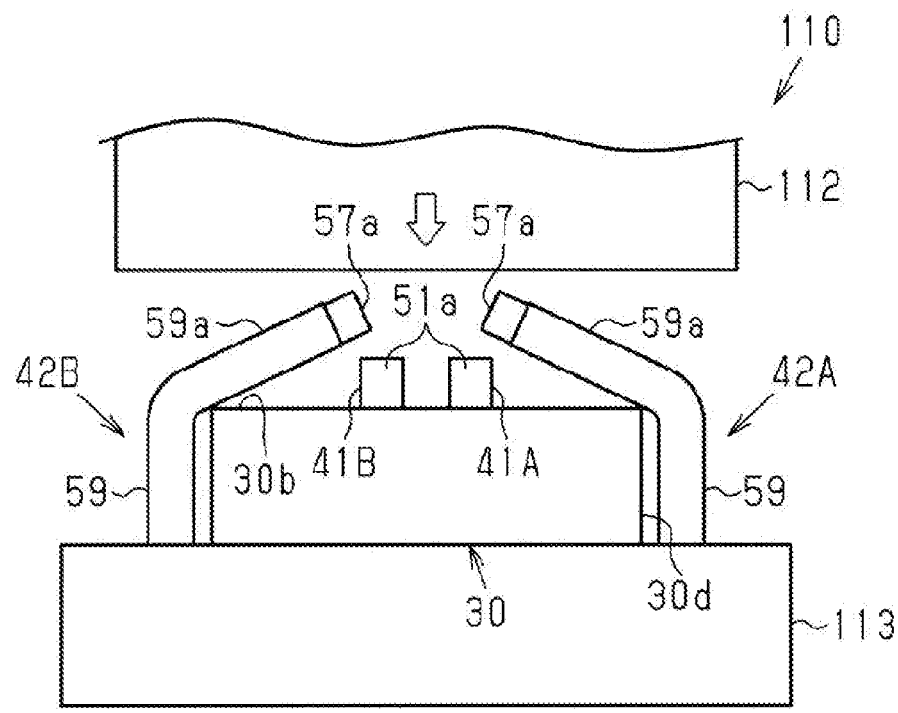

FIGS. 11A and 11B illustrate the coil piece bending step. That is, FIGS. 11A and 11B illustrate the bending step of the second coil pieces 42A and 42B. As illustrated in FIG. 11A, the jig 100 (see FIGS. 10A and 10B) to which the first to fifth coil pieces 41A to 45A and 41B to 45B are temporarily fixed is placed on a lower die 113 of a pressing machine 110. Then, the projecting portions 59a of the second coil pieces 42A and 42B are bent by a first upper die 111.

The first upper die 111 moves from the outside toward the inside of the core 30. The first upper die 111 moves by a half of the arrangement pitch in the direction along the straight portions 31 of the core 30 while moving from the outside toward the inside of the core 30. Therefore, forces in a direction indicated by outlined arrows in FIG. 11A are applied to the respective projecting portions 59a, and thus, each of the projecting portions 59a is bent such that the joint surface 57a which is a tip surface of the projecting portion 59a is located at a position different from a position of a portion, facing the external surface 30d of the core 30, of the third straight portion 59 corresponding to the projecting portion 59a, in the direction in which the straight portions 31 (see FIG. 3) of the core 30 extend. After being bent inward in this way, the respective projecting portions 59a are bent toward the second end surface 30b of the core 30 by a second upper die 112 as illustrated in FIG. 11B. Thus, the external straight portion 55, the third curved portion 56, and the second straight portion 57 (see FIG. 4 for these parts) are formed from the third straight portion 59. Further, the third curved portion 56 and the second straight portion 57 are formed from the projecting portion 59a.

Notably, in the coil piece bending step, the projecting portions 59a of the first coil pieces 41A and 41B and the third to fifth coil pieces 43A to 45A and 43B to 45B are also bent in the same manner as the projecting portions 59a of the second coil pieces 42A and 42B. In this step, the pressing machine 110 simultaneously bends all of the first to fifth coil pieces 41A to 45A by the first upper die 111, and simultaneously bends the projecting portions 59a of all of the first to fifth coil pieces 41B to 45B by the first upper die 111. The pressing machine 110 also simultaneously bends the projecting portions 59a of all of the first to fifth coil pieces 41A to 45A and 41B to 45B by the second upper die 112.

Figure 12A:
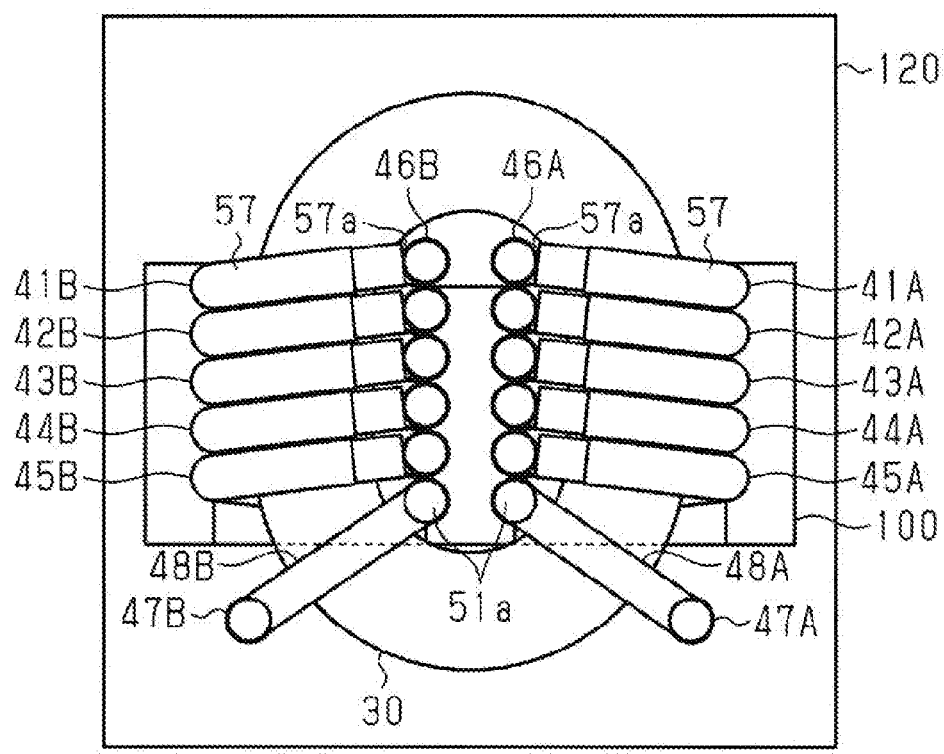
FIGS. 12A and 12B are explanatory views illustrating the method for manufacturing the inductor.

After the coil piece bending step is ended, the joint surface 57a of the second coil piece 42A is in contact with the side surface of the joint portion 51a of the first coil piece 41A as illustrated in FIG. 12A. In this way, the joint portion 51a of the first coil piece 41A and the joint surface 57a of the second coil piece 42A are in contact with each other by bending the projecting portion 59a of the second coil piece 42A. Similarly, the joint surface 57a of the third coil piece 43A is in contact with the side surface of the joint portion 51a of the second coil piece 42A, the joint surface 57a of the fourth coil piece 44A is in contact with the side surface of the joint portion 51a of the third coil piece 43A, and the joint surface 57a of the fifth coil piece 45A is in contact with the side surface of the joint portion 51a of the fourth coil piece 44A. In addition, the first to fifth coil pieces 41B to 45B are formed in the same manner as the first to fifth coil pieces 41A to 45A.

Figure 12B:
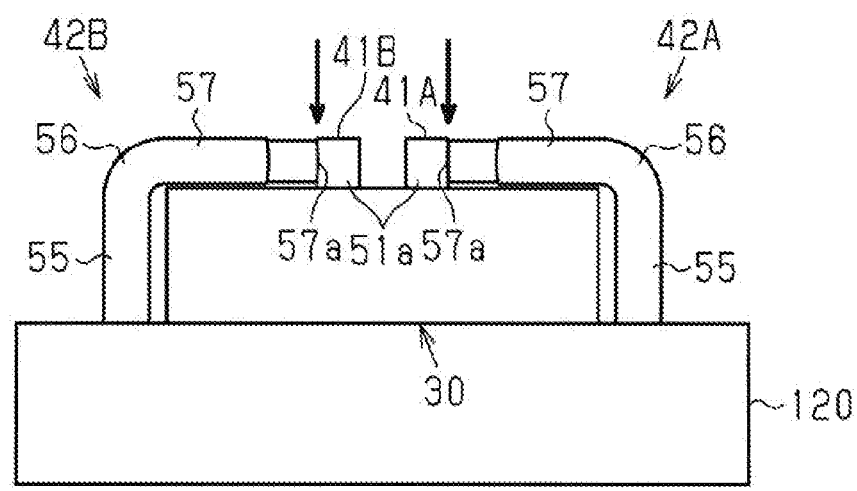

FIGS. 12A and 12B illustrate the welding step, wherein FIG. 12B illustrates the welding of the first coil pieces 41A and 41B and the second coil pieces 42A and 42B.

The welding step includes a step for connecting the electrode members and the connection pieces to the coil pieces. More specifically, the first electrode members 46A and 46B and the second electrode members 47A and 47B are respectively mounted to a jig 120, and the jig 100 that holds the assembly of the core 30 and the first to fifth coil pieces 41A to 45A and 41B to 45B is mounted to the jig 120, as illustrated in FIG. 12A. Thus, the first electrode members 46A and 46B and the joint surfaces 57a of the first coil pieces 41A and 41B are in contact with each other. In addition, the connection piece 48A is attached to the side surface of the joint portion 51a of the fifth coil piece 45A and the side surface of the second electrode member 47A, and the connection piece 48B is attached to the side surface of the joint portion 51a of the fifth coil piece 45B and the side surface of the second electrode member 47B.

Next, as illustrated in FIGS. 12A and 12B, the respective joint sections of the first to fifth coil pieces 41A to 45A, the first electrode member 46A, the second electrode member 47A, and the connection piece 48A are irradiated with laser light from above from the same direction, more specifically, such that the laser light is incident parallel to the direction in which the internal straight portions 51 extend. Thus, the respective joint sections are welded. Thick arrows in FIG. 12B indicate the irradiation position and irradiation direction of the laser light. The positions irradiated with laser light are the contact position between the joint surface 57a of the first coil piece 41A and the first electrode member 46A, the contact positions between the joint surfaces 57a of the second to fifth coil pieces 42A to 45A and the joint portions 51a of the first to fourth coil pieces 41A to 44A, and the contact positions between the connection piece 48A and the joint portion 51a of the fifth coil piece 45A and the second electrode member 47A (see FIG. 12A). The respective joint sections of the second to fifth coil pieces 42B to 45B, the first electrode member 46B, the second electrode member 47B, and the connection piece 48B are also welded as in the respective joint sections of the first to fifth coil pieces 41A to 45A, the first electrode member 46A, the second electrode member 47A, and the connection piece 48A. As the laser welding device, a YAG laser or a fiber laser can be used, for example. Thus, the first coil 40A and the second coil 40B are formed.

Figure 13:
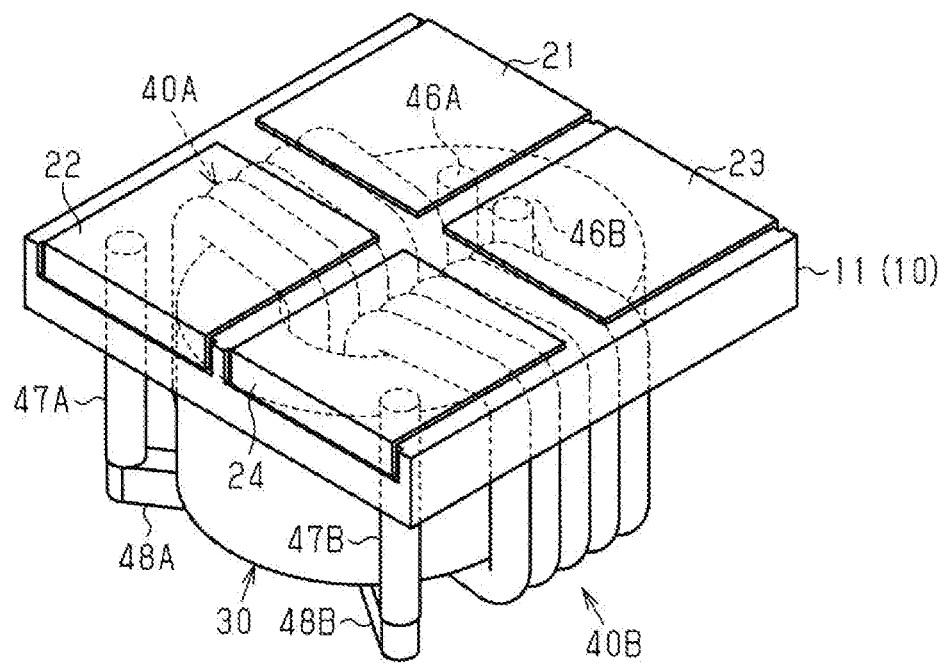
FIG. 13 is an explanatory view illustrating the method for manufacturing the inductor.

FIG. 13 illustrates the electrode connection step. As illustrated in FIG. 13, the first coil 40A, the second coil 40B, and the core 30 are mounted to the first case 11 having the first to fourth electrode terminals 21 to 24 mounted thereto. Then, the electrode members 46A, 47A, 46B, and 47B are electrically connected to the first to fourth electrode terminals 21, 22, 23, and 24, respectively, by crimping or by means of a joint material.

Figure 14:
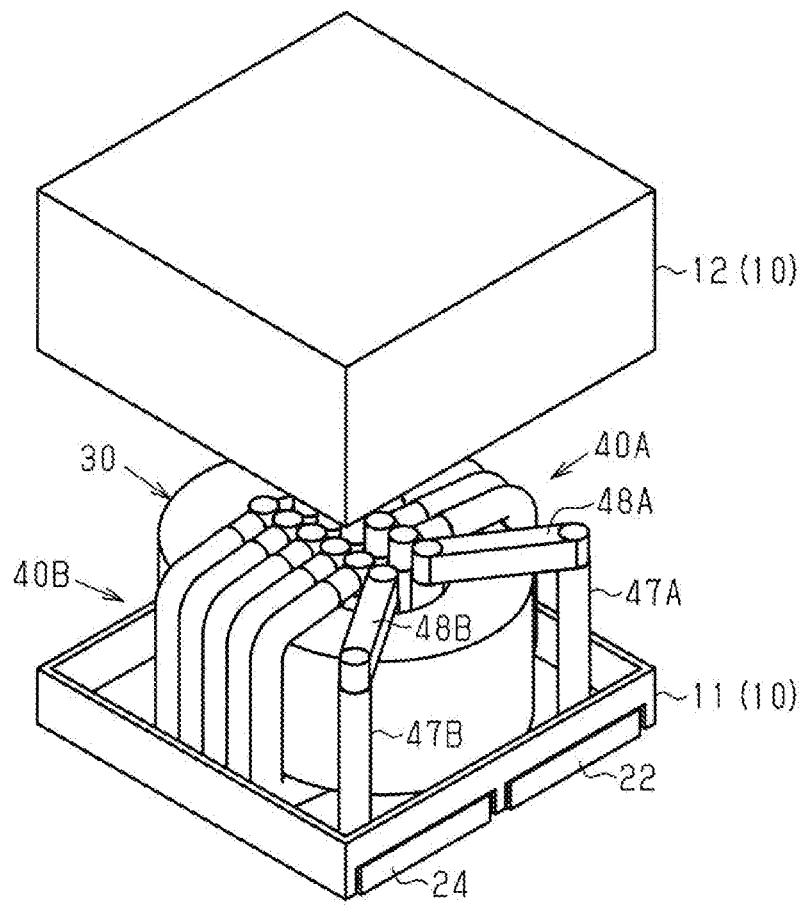
FIG. 14 is an explanatory view illustrating the method for manufacturing the inductor.

FIG. 14 illustrates the case attaching step. As illustrated in FIG. 14, the second case 12 is attached to the first case 11. The second case 12 is fixed to the first case 11 by means of an adhesive, for example. Note that the second case 12 may be fixed to the first case 11 by being fitted thereto.

Notably, the electrode connection step may be performed before the welding step during the manufacturing process of the inductor 1. In this case, the core 30 around which the first to fifth coil pieces 41A to 45A and 41B to 45B are wound is attached to the first case 11 in which the electrode members 46A, 47A, 46B, and 47B are connected to the first to fourth electrode terminals 21, 22, 23 and 24. Then, the connection pieces 48A and 48B are attached to the fifth coil pieces 45A and 45B and the second electrode members 47A and 47B, and the joint sections of the first to fifth coil pieces 41A to 45A and 41B to 45B, the electrode members 46A, 46B, 47A, and 47B, and the connection pieces 48A and 48B are welded.

As described above, the present embodiment provides the following effects. Although the effect of the first coil 40A is described below, the similar effect to the first coil 40A can be obtained for the second coil 40B.

(1-1) The first coil piece 41A and the second coil piece 42A are continuously wound around the core 30 along the internal surface 30c, the first end surface 30a, the external surface 30d, and the second end surface 30b, whereby there is only one joint portion of coil pieces required for forming a two-turn coil formed by the first coil piece 41A and the second coil piece 42A. That is, connection portions other than the connection portions at both ends of the first coil 40A of one turn are not formed. Accordingly, the number of joint portions can be decreased, whereby the resistance value of the first coil 40A can be reduced. Regarding the first coil piece 41A, the first electrode member 46A, and the third to fifth coil pieces 43A to 45A, the number of connection portions is also similarly decreased, whereby the resistance value of the first coil 40A can further be reduced. In addition, the number of joint portions is reduced as described above, resulting in that a time required for the welding process in the welding step can be shortened. Accordingly, production cost of the inductor 1 can be reduced.

(1-2) The first coil piece 41A and the second coil piece 42A are joined with the weld section 58 between the joint portion 51a of the first coil piece 41A and the joint surface 57a of the second coil piece 42A. Therefore, the weld section 58 is formed from a metal material same as the material of the first coil piece 41A and the material of the second coil piece 42A, respectively, whereby an interface which is likely to occur in joining dissimilar metals is hardly caused between the weld section 58 and the first coil piece 41A and between the weld section 58 and the second coil piece 42A. Accordingly, the resistance value of the first coil 40A can be reduced, as compared to a configuration where the first coil piece 41A and the second coil piece 42A are joined by means of a joint material such as a solder, for example. Notably, the effect regarding the weld section 58 between the joint portion 51a of the first coil piece 41A and the joint surface 57a of the second coil piece 42A is also obtained regarding the weld section 58 between the first coil piece 41A and the first electrode member 46A, the weld sections 58 of the second to fifth coil pieces 42A to 45A, and the weld sections 58 between the connection piece 48A and the fifth coil piece 45A and between the connection piece 48A and the second electrode member 47A. Therefore, the resistance value of the first coil 40A can further be reduced.

(1-3) The joint portion 51a of the first coil piece 41A and the joint surface 57a of the second coil piece 42A are located inside of the internal surface 30c of the core 30. That is, the third straight portion 59 of the second coil piece 42A is bent from the outside of the external surface 30d of the core 30. According to this configuration, the first upper die 111 of the pressing machine 110 for bending the third straight portion 59 of the second coil piece 42A from the external surface 30d of the core 30 such that the third straight portion 59 covers the second end surface 30b is disposed outside of the core 30, whereby the first upper die 111 is easy to be disposed. Thus, it becomes easy to bend the second coil piece 42A, resulting in that the first coil 40A can easily be formed. In addition, the first coil piece 41A and the third to fifth coil pieces 43A to 45A are also easy to be bent in the same manner as described above, whereby the first coil 40A can more easily be formed.

Furthermore, the joint portions 51a and the joint surfaces 57a of the first to fifth coil pieces 41A to 45A are aligned in line along the straight portion 31 of the core 30. Also, the distance between the adjacent joint portions 51a of the first to fifth coil pieces 41A to 45A is short, which decreases the time required for the welding process for the joint portions 51a and the joint surfaces 57a by laser welding.

In addition, the second straight portions 57 of the first to fifth coil pieces 41A to 45A are substantially parallel to one another. Accordingly, the first to fifth coil pieces 41A to 45A can simultaneously be bent by the first upper die 111. Thus, the time required for forming the first coil 40A can be decreased.

(1-4) In the coil piece bending step, the projecting portion 59a of the second coil piece 42A is bent toward the joint portion 51a of the first coil piece 41A, by which the joint surface 57a of the second coil piece 42A is brought into contact with the joint portion 51a of the first coil piece 41A. In this way, the first coil 40A of one turn can be formed by bending the projecting portion 59a of the second coil piece 42A only once. Therefore, the number of times of bending the first coil piece 41A and the second coil piece 42A is less than that in a configuration where both the joint portion of the first coil piece 41A and the projecting portion of the second coil piece 42A are bent to form the first coil 40A of one turn. Thus, the first coil 40A can easily be formed. Also, the projecting portions 59a of the first coil piece 41A and the third to fifth coil pieces 43A to 45A are also bent in the same manner as the projecting portion 59a of the second coil piece 42A, whereby the first coil 40A can more easily be formed.

(1-5) In the welding step, the joint sections of the joint portions 51a and the joint surfaces 57a of the first to fifth coil pieces 41A to 45A, the first and the second electrode members 46A and 47A, and the connection piece 48A are all exposed upwardly. Therefore, the joint sections can be irradiated with laser light from the same direction by the laser welding device. In addition, it is unnecessary to change the positions of the first to fifth coil pieces 41A to 45A, the first and second electrode members 46A and 47A, and the connection piece 48A with respect to the laser welding device, and even if a position change is needed, an amount of change is small. Accordingly, the welding process can be performed within a short period. Further, the weld sections 58 can be visually confirmed from one direction, and therefore, a weld section having a welding defect can easily be confirmed.

(1-6) The joint portion 51a of the fifth coil piece 45B and the second electrode member 47B are cylindrical, and the end surfaces 48x and 48y of the connection piece 48B are a recessed cylindrical surface having a curvature equal to the curvature of the joint portion 51a and the second electrode member 47B. Therefore, even if the position of the connection piece 48B about an axis of the joint portion 51a of the fifth coil piece 45B and the position of the connection piece 48B about an axis of the second electrode member 47B are respectively changed, the contact area between the connection piece 48B and the fifth coil piece 45B and the contact area between the connection piece 48B and the second electrode member 47B are unchanged, and if changed, an amount of change is very small. Accordingly, a degree of freedom in disposing the joint portion 51a of the fifth coil piece 45B, the second electrode member 47B, and the connection piece 48B is increased. Thus, even if the position of the second electrode member 47B with respect to the fifth coil piece 45B varies, the configuration described above can suppress a reduction in the contact area caused by such a variation and an increase in the resistance value at the joint section between the connection piece 48B and the fifth coil piece 45B and at the joint section between the connection piece 48B and the second electrode member 47B.

Second Embodiment

A second embodiment of the inductor 1 and a method for manufacturing the inductor 1 will be described with reference to FIGS. 15 to 17. The inductor 1 according to the present embodiment is different in shape and joint structure at both ends of each of the first to fifth coil pieces 41A to 45A and 41B to 45B from the inductor 1 according to the first embodiment. It is to be noted that, in the present embodiment, the components same as those in the first embodiment are given identical reference marks, and the description thereof will be omitted as appropriate. Further, description of relations between the same components will be omitted as appropriate.

Figure 15:
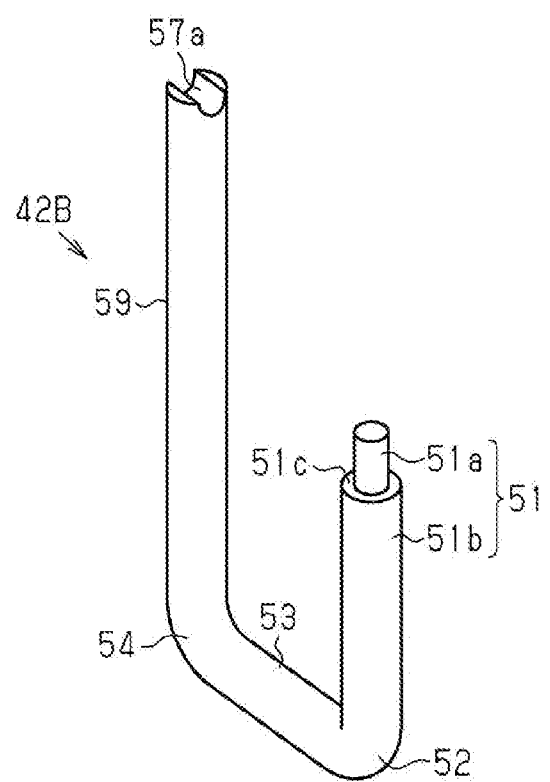
FIG. 15 is a perspective view illustrating a second coil piece in an inductor according to a second embodiment.

As illustrated in FIG. 15, the outer diameter of the joint portion 51a of the internal straight portion 51 of the second coil piece 42B is smaller than the outer diameter of the main body part 51b of the internal straight portion 51. Accordingly, a step portion 51c is formed between the main body part 51b and the joint portion 51a. The joint portion 51a of the internal straight portion 51 of the first coil piece 41B also has a shape similar to the shape of the joint portion 51a of the second coil piece 42B as illustrated in FIG. 16.

Figure 16:
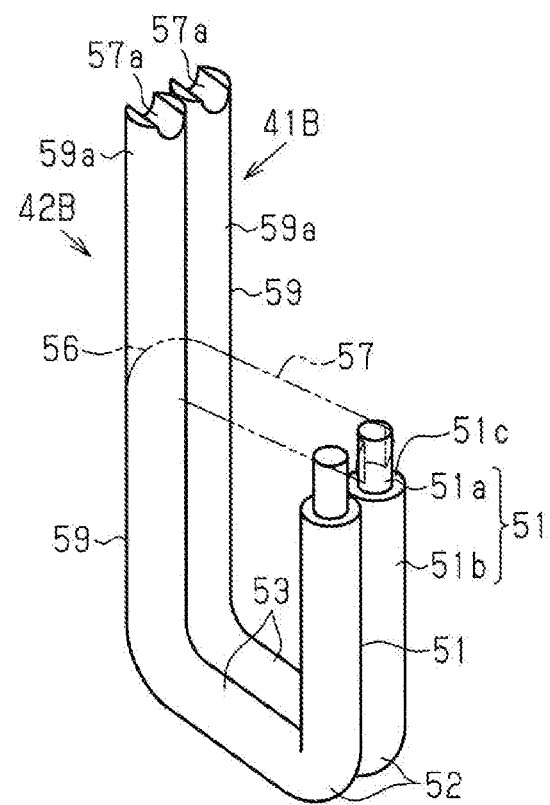
FIG. 16 is a perspective view illustrating first and second coil pieces in the inductor according to the second embodiment.

As illustrated in FIG. 16, an end surface of the projecting portion 59a of the second coil piece 42B, that is, the joint surface 57a of the second straight portion 57, and the side surface of the joint portion 51a of the first coil piece 41B are formed into shapes fitted to each other. Specifically, the joint surface 57a of the second coil piece 42B is formed into a shape conforming to the side surface of the joint portion 51a of the first coil piece 41B (a shape mating with the other surface when the respective surfaces are fitted to each other and in contact with each other). Therefore, when the projecting portion 59a of the third straight portion 59 of the second coil piece 42B is bent toward the joint portion 51a of the first coil piece 41B to be in contact with the step portion 51c, the end surface of the projecting portion 59a of the second coil piece 42B is fitted to the joint portion 51a of the first coil piece 41B. A section where the shapes of the respective portions mate each other and are in surface contact with each other as described above is referred to as a fitted section. Due to the fitted section described above, the joint between the first coil piece 41B and the second coil piece 42B is facilitated.

Specifically, the joint surface 57a of the second coil piece 42B is a recessed cylindrical surface mating with the side surface of the cylindrical joint portion 51a of the first coil piece 41B and having a curvature equal to the curvature of this side surface. The circumferential length of the recessed cylindrical surface is equal to a half of the circumferential length of the side surface of the joint portion 51a of the first coil piece 41B. In this way, the joint surface 57a of the second coil piece 42B is formed to have an area larger than an average sectional area of the second coil piece 42B. Herein, the average sectional area is a value obtained by dividing the volume of a member by a current path (length).

Figure 17:
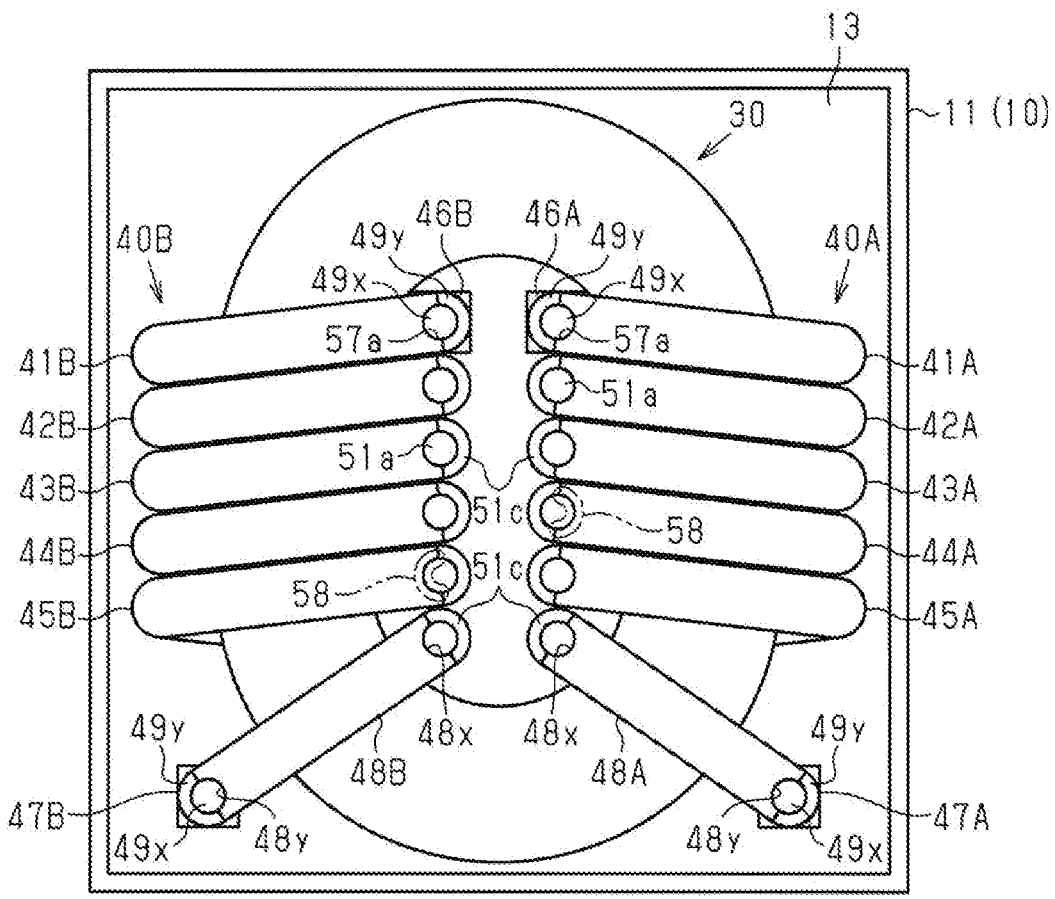
FIG. 17 is a schematic plan view illustrating the inductor according to the second embodiment.

As illustrated in FIG. 17, the first coil piece 41A, the second coil piece 42A, and the third to fifth coil pieces 43A to 45A and 43B to 45B are also similarly formed with the step portion 51c. Further, the joint surfaces 57a of the first coil piece 41A, the second coil piece 42A, and the third to fifth coil pieces 43A to 45A and 43B to 45B are also similarly a recessed cylindrical surface. Therefore, as illustrated in FIG. 17, the joint surface 57a of the second coil piece 42A and the side surface of the joint portion 51a of the first coil piece 41A are formed into shapes fitted to each other. The joint surfaces 57a of the third coil pieces 43A and 43B and the side surfaces of the joint portions 51a of the second coil pieces 42A and 42B are formed into shapes fitted to each other. The joint surfaces 57a of the fourth coil pieces 44A and 44B and the side surfaces of the joint portions 51a of the third coil pieces 43A and 43B are formed into shapes fitted to each other. The joint surfaces 57a of the fifth coil pieces 45A and 45B and the side surfaces of the joint portions 51a of the fourth coil pieces 44A and 44B are formed into shapes fitted to each other. The side surfaces of the joint portions 51a of the fifth coil pieces 45A and 45B and the end surfaces 48x of the connection pieces 48A and 48B are formed into shapes fitted to each other.

Each of the electrode members 46A, 46B, 47A, and 47B is provided with a joint portion 49x and a step portion 49y as in the internal straight portion 51 (see FIG. 15). The joint surfaces 57a of the first coil pieces 41A and 41B and the side surfaces of the joint portions 49x of the first electrode members 46A and 46B are formed into shapes fitted to each other. Specifically, the joint surface 57a of each of the first coil pieces 41A and 41B is formed into a shape conforming to the side surface of the joint portion 49x of each of the first electrode members 46A and 46B (a shape mating with the other surface when the respective surfaces are fitted to each other and in contact with each other). The end surface 48y of each of the connection pieces 48A and 48B and the side surface of each of the second electrode members 47A and 47B are formed into shapes fitted to each other. Specifically, the end surface 48y of each of the connection pieces 48A and 48B is formed into a shape conforming to the side surface of each of the second electrode members 47A and 47B (a shape mating with the other surface when the respective surfaces are fitted to each other and in contact with each other).

In a case where a laser device, such as a YAG laser, which has a large laser irradiation area (spot diameter) and has a higher peak in irradiation energy is used as a laser device for irradiating the fitted sections with laser during the manufacture of the inductor 1, the laser device performs spot irradiation of laser light to the fitted sections. For example, a laser device with a peak energy of 7 kW, irradiation time of 10 ms, irradiation energy of 70 J, spot diameter of 0.5 mm, and power density of about 350 W/cm$^2$ can be used as the YAG laser. The two members constituting each joint section are melted by the laser light, and due to solidification, the weld section 58 is formed. While only the fitted section between the joint portion 51a of the third coil piece 43A and the joint surface 57a of the fourth coil piece 44A and the fitted section between the joint portion 51a of the fourth coil piece 44B and the joint surface 57a of the fifth coil piece 45B are denoted by the reference number "58" in FIG. 17 for the sake of convenience, the weld section 58 is also formed at each of the other fitted sections.

In a case where a laser device, such as a fiber laser, which has a small irradiation area (spot diameter) and has a lower peak in irradiation energy is used as a device for emitting laser light, the device continuously emits laser light along the fitted section. For example, a laser device with a peak energy of 1 kW, irradiation time of 200 ms, irradiation energy of 200 J, spot diameter of 0.04 mm, and power density of about 8000 W/cm$^2$ can be used as the fiber laser. In this case, the weld section 58 is formed to extend along the joint surface 57a and the side surfaces of the joint portions 51a and 49x fitted to the joint surface 57a. The weld section 58 is also formed to extend along the end surfaces 48x and 48y of the connection pieces 48A and 48B and the side surfaces of the joint portions 51a and 49x fitted to the end surfaces 48x and 48y. As described above, an irradiation position can be narrowed by laser light having a small irradiation area, whereby the irradiation position can be controlled with high precision. Therefore, reflection or irradiation of laser light with respect to the other sections can be reduced.

As described above, the present embodiment provides the following effects in addition to the effects provided by the first embodiment. While the effect regarding the joint section between the first coil piece 41A and the second coil piece 42A will be described below, the similar effect can be obtained regarding the joint section between the first coil piece 41A and the first electrode member 46A, the joint sections of the second to fifth coil pieces 42A to 45A, and the joint sections of the fifth coil piece 45A, the connection piece 48A, and the second electrode member 47A. In addition, the similar effect can be obtained regarding the respective joint sections of the second coil 40B.

(2-1) The side surface of the joint portion 51a of the first coil piece 41A and the joint surface 57a of the second coil piece 42A are in contact with each other with the joint surface 57a of the second coil piece 42A being fitted to the side surface of the joint portion 51a of the first coil piece 41A, that is, with shapes conforming to each other. Therefore, a gap is hardly formed between the joint portion 51a of the first coil piece 41A and the joint surface 57a of the second coil piece 42A. Accordingly, heat of the laser light is easy to be conducted while the joint portion 51a of the first coil piece 41A and the joint surface 57a of the second coil piece 42A are joined. Thus, the joint area between the side surface of the joint portion 51a and the joint surface 57a can be increased. This results in a reduction in the resistance value at the joint section, which enables a flow of a high current through the first coil 40A. For example, an inductor through which a high current of a level of 15 A can flow can be used as an inductor through which a high current of a level of 20 A can flow. In addition, because heat is easily conducted, joining can be performed in a short period by laser light with a constant output, whereby the processing speed in the welding step can be increased. On the other hand, even if laser light with a low output is used, satisfactory joining can be achieved.

In addition, the joint surface 57a of the second coil piece 42A and the joint portion 51a of the first coil piece 41A are fitted to each other, which can suppress a shift of the contact position between the joint surface 57a of the second coil piece 42A and the joint portion 51a of the first coil piece 41A due to springback which is caused when the projecting portion 59a of the second coil piece 42A is bent.

(2-2) The area of the joint surface 57a of the second coil piece 42A is larger than the average sectional area of the second coil piece 42A, and accordingly, the contact area between the side surface of the joint portion 51a of the first coil piece 41A and the joint surface 57a of the second coil piece 42A can be increased by a commensurate amount. Thus, the resistance value at the joint section between the first coil piece 41A and the second coil piece 42A can be reduced.

Moreover, in the welding step, the weld area of the weld section 58 can be easily made larger than the average sectional area of the second coil piece 42A, as compared to a configuration where the joint surface 57a of the second coil piece 42A is equal to the average sectional area of the second coil piece 42A. Therefore, the joint strength at the joint section between the first coil piece 41A and the second coil piece 42A is easy to be increased. In addition, if it is only necessary that a weld area equal to the average sectional area of the second coil piece 42A can be ensured at a minimum, the weld section 58 can be formed without need of high precise alignment of a machine (for example, an irradiation position of laser light emitted from a laser welding device) used for joining the first coil piece 41A and the second coil piece 42A. Thus, a time required for the welding step can be shortened.

(2-3) The projecting portion 59a of the second coil piece 42A is fitted to the joint portion 51a of the first coil piece 41A while being positioned with respect to the first coil piece 41A by the step portion 51c of the first coil piece 41A. Therefore, in the welding step, positional misalignment between the joint surface 57a of the second coil piece 42A and the joint portion 51a of the first coil piece 41A hardly occurs, whereby a time required for the welding step can be shortened.

(2-4) The joint portion 51a of the first coil piece 41A has a cylindrical shape, and the joint surface 57a of the second coil piece 42A has a recessed cylindrical surface having a curvature equal to the curvature of the joint portion 51a of the first coil piece 41A. Therefore, even if an angle formed by the projecting portion 59a (second straight portion 57) of the second coil piece 42A and the joint portion 51a of the first coil piece 41A is changed, that is, even if the position of the second straight portion 57 of the second coil piece 42A about the axis of the joint portion 51a of the first coil piece 41A is changed, the contact area between the side surface of the joint portion 51a and the joint surface 57a is unchanged, and if changed, an amount of change is very small. Therefore, a degree of freedom in disposing the first coil piece 41A and the second coil piece 42A is increased. Thus, even if the positional relation between the side surface of the joint portion 51a of the first coil piece 41A and the joint surface 57a of the second coil piece 42A fitted to the side surface varies, a reduction in the contact area caused by such a variation can be suppressed, and an increase in the resistance value at the joint section between the first coil piece 41A and the second coil piece 42A can also be suppressed. In addition, in the welding step, positional misalignment between the first coil piece 41A and the second coil piece 42A hardly occurs, whereby an occurrence of welding defects can be prevented, and a yield can be improved.

Third Embodiment

A third embodiment of the inductor 1 and a method for manufacturing the inductor 1 will be described with reference to FIGS. 18, 19A and 19B. The inductor 1 according to the present embodiment is different in a part of steps of the manufacturing method from the inductor 1 according to the first embodiment. It is to be noted that, in the present embodiment, the components same as those in the first embodiment are given identical reference marks, and the description thereof will be omitted as appropriate. Further, description of relations between the same components will be omitted as appropriate.

Figure 18:
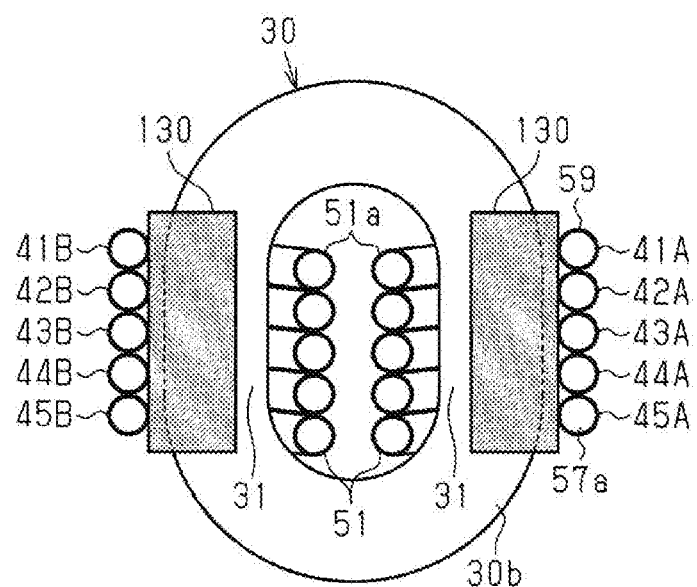
FIG. 18 is a schematic plan view illustrating an inductor according to a third embodiment.

As illustrated in FIG. 18, in the core disposing step (step S2 in FIG. 7), a support jig 130 is mounted to each straight portion 31 of the core 30. The support jig 130 is formed from a synthetic resin, for example. The support jig 130 covers the outer peripheral part including the outer peripheral end of the second end surface 30b. The support jig 130 covers the second end surface 30b of the core 30 corresponding to the regions where the first to fifth coil pieces 41A to 45A and 41B to 45B are disposed in the direction in which the straight portion 31 extends. The support jig 130 in the present embodiment covers the second end surface 30b throughout the straight portion 31 in the direction in which the straight portion 31 extends. As illustrated in FIG. 19A, the support jig 130 covers the end, which is near the second end surface 30b, of the external surface 30d of the core 30.

Figure 19A:
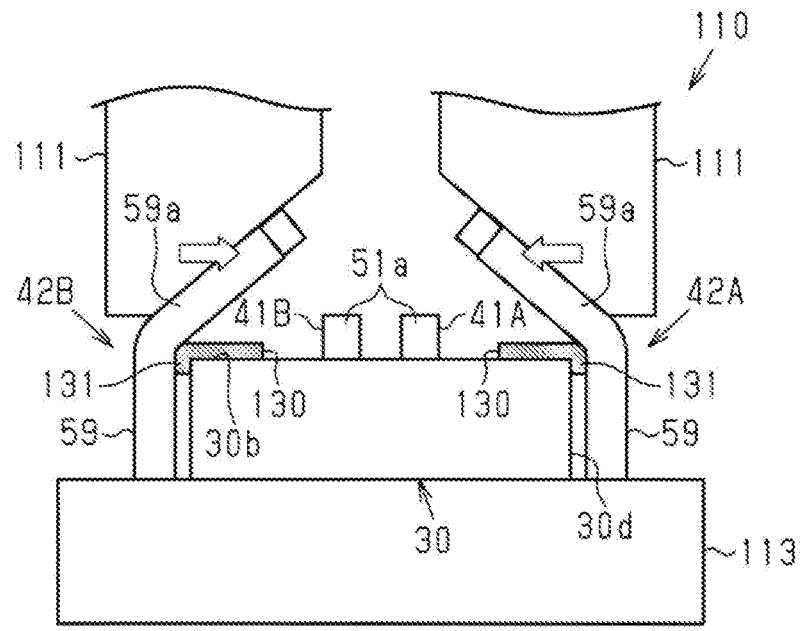
FIGS. 19A and 19B are explanatory views illustrating the method for manufacturing the inductor.
Figure 19B:
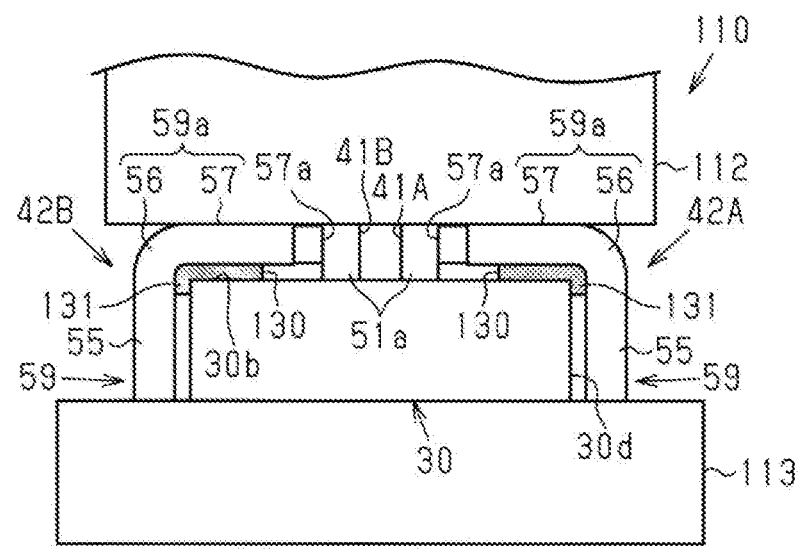

FIGS. 19A and 19B illustrate the coil piece bending step (step S3 in FIG. 7). That is, FIGS. 19A and 19B illustrates the bending step of the second coil pieces 42A and 42B. As illustrated in FIG. 19A, the third straight portions 59 of the second coil pieces 42A and 42B are in contact with outer peripheral parts 131 of the support jigs 130, the outer peripheral parts 131 covering the external surface 30d of the core 30. With this state, the first upper die 111 of the pressing machine 110 bends the projecting portions 59a of the third straight portions 59 inward, so that the projecting portions 59a are bent at the contact sections between the outer peripheral parts 131 of the support jigs 130 and the third straight portions 59, as a fulcrum.

Then, as illustrated in FIG. 19B, after the second upper die 112 of the pressing machine 110 bends the projecting portions 59a of the second coil pieces 42A and 42B to bring the joint surfaces 57a of the first coil pieces 41A and 41B into contact with the joint portions 51a, the support jigs 130 are pulled out along the direction in which the straight portions 31 (see FIG. 18) of the core 30 extend. Notably, the projecting portions 59a of the first coil pieces 41A and 41B and the third to fifth coil pieces 43A to 45A and 43B to 45B are also bent in the same manner as the projecting portions 59a of the second coil pieces 42A and 42B.

As described above, the present embodiment provides the following effects in addition to the effects provided by the first embodiment.

(3-1) When the projecting portion 59a of the third straight portion 59 of the second coil piece 42A is bent, the third straight portion 59 may collapse inward at the second curved portion 54 as a fulcrum. In view of this, the support jig 130 is attached to the core 30 in advance, by which, when the projecting portion 59a is bent, the third straight portion 59 is supported by the support jig 130. That is, when being bent, the projecting portion 59a presses the support jig 130. In other words, when being bent, the projecting portion 59a does not directly press the core 30. Therefore, damage to the core 30 caused by the projecting portion 59a pressing the core 30 can be suppressed. In addition, due to the support jig 130 being pulled out, an increase in the weight of the inductor 1 can be suppressed. Note that the effect by the support jig 130 can also be obtained for the first coil pieces 41A and 41B and the third to fifth coil pieces 43A to 45A and 43B to 45B.

Fourth Embodiment

A fourth embodiment of the inductor 1 and a method for manufacturing the inductor 1 will be described with reference to FIGS. 20 and 21. The inductor 1 according to the present embodiment is different from the inductor 1 according to the first embodiment in that an insulating material 60 is additionally provided. It is to be noted that, in the present embodiment, the components same as those in the first embodiment are given identical reference marks, and the description thereof will be omitted as appropriate. Further, description of relations between the same components will be omitted as appropriate.

Figure 20:
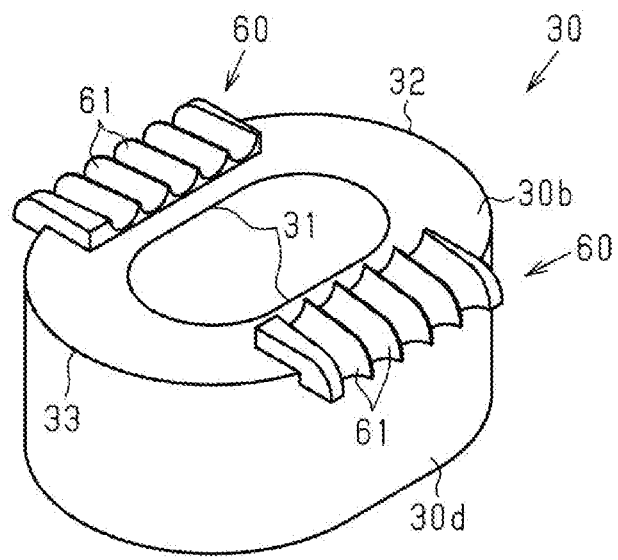
FIG. 20 is an exploded perspective view illustrating an inductor according to a fourth embodiment.
Figure 20:
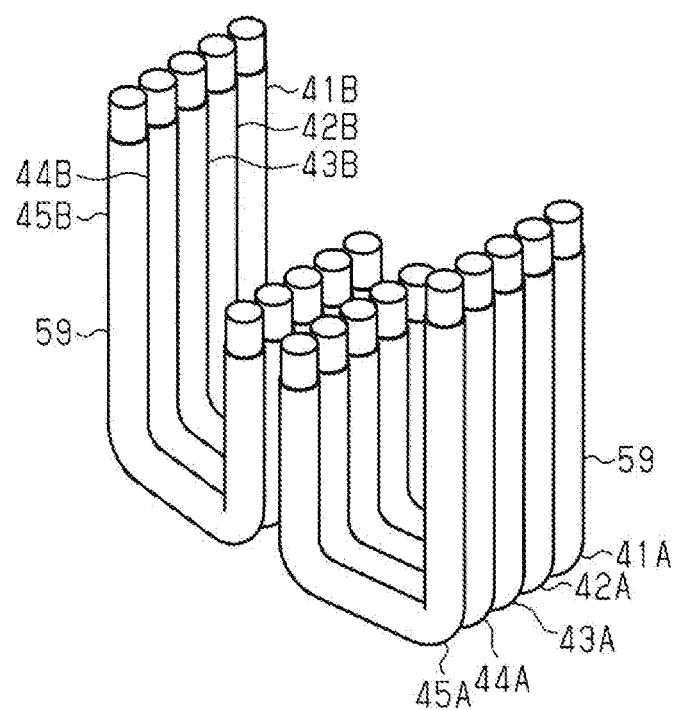
Figure 21:
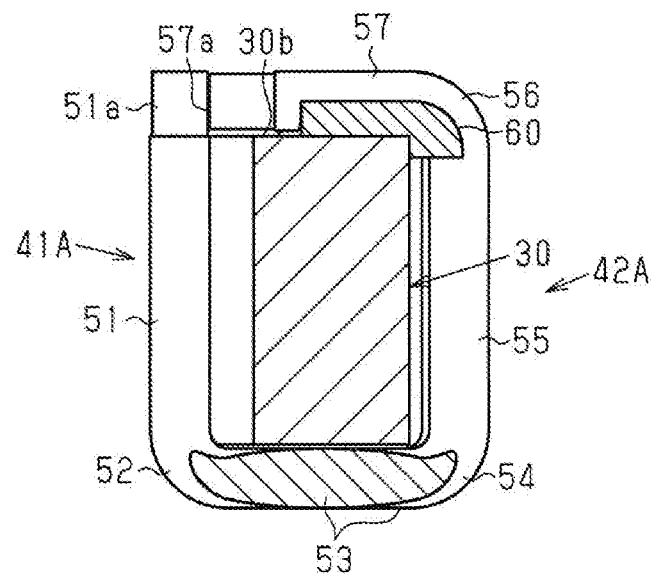
FIG. 21 is a schematic sectional view illustrating the inductor according to the fourth embodiment.

As illustrated in FIG. 20, the insulating material 60 formed from a resin and having electrical insulating properties is attached to each straight portion 31 of the core 30. The insulating material 60 covers the outer peripheral part including the outer peripheral end of the second end surface 30b of the core 30 and the end of the external surface 30d near the second end surface 30b. Thus, the insulating material 60 protects the core 30 from other members such as the first to fifth coil pieces 41A to 45A and 41B to 45B. The insulating materials 60 have formed therein grooves 61 corresponding to the first to fifth coil pieces 41A to 45A and 41B to 45B.

When the third straight portions 59 of the first to fifth coil pieces 41A to 45A and 41B and 45B are bent, the first to fifth coil pieces 41A to 45A are disposed in the grooves 61 of one of the insulating materials 60, and the first to fifth coil pieces 41B to 45B are disposed in the grooves 61 of the other insulating material 60. Thus, as illustrated in FIG. 21, one of the insulating materials 60 is held between the second end surface 30b of the core 30 and the second straight portion 57 of the second coil piece 42A. The relations between the insulating materials 60 and the first coil pieces 41A and 41B, the second coil piece 42B, and the third to fifth coil pieces 43B to 45A and 43B to 45B are similar to the relation between the second coil piece 42A and the insulating material 60. In this way, one of the insulating materials 60 supports the third curved portions 56 and the second straight portions 57 of the first to fifth coil pieces 41A to 45A, and the other insulating material 60 supports the third curved portions 56 and the second straight portions 57 of the first to fifth coil pieces 41B to 45B.

As described above, the present embodiment provides the following effects in addition to the effects provided by the first embodiment.

(4-1) Due to the insulating material 60 attached to the core 30, the projecting portion 59a of the second coil piece 42A presses the insulating material 60 when being bent. In other words, when being bent, the projecting portion 59a does not directly press the core 30. Therefore, damage to the core 30 caused by the projecting portion 59a pressing the core 30 can be suppressed. Note that the effect by the insulating materials 60 can also be obtained for the first coil pieces 41A and 41B and the third to fifth coil pieces 43A to 45A and 43B to 45B.

Fifth Embodiment

A fifth embodiment of the inductor 1 and a method for manufacturing the inductor 1 will be described with reference to FIGS. 22 to 24. The inductor 1 according to the present embodiment is different in a portion of the configuration of the first to fifth coil pieces 41A to 45A and 41B to 45B from the inductor 1 according to the first embodiment. It is to be noted that, in the present embodiment, the components same as those in the first embodiment are given identical reference marks, and the description thereof will be omitted as appropriate. Further, description of relations between the same components will be omitted as appropriate.

Figure 22:
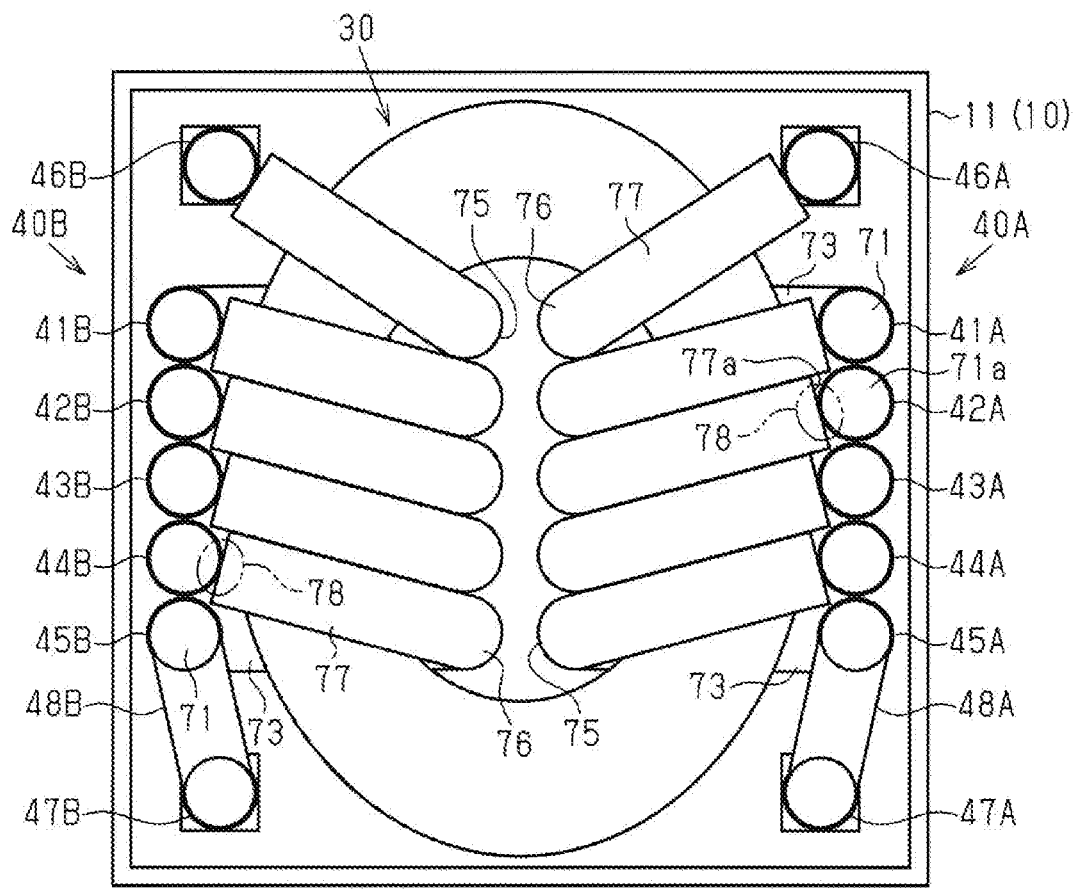
FIG. 22 is a schematic plan view illustrating an inductor according to a fifth embodiment.
Figure 23:
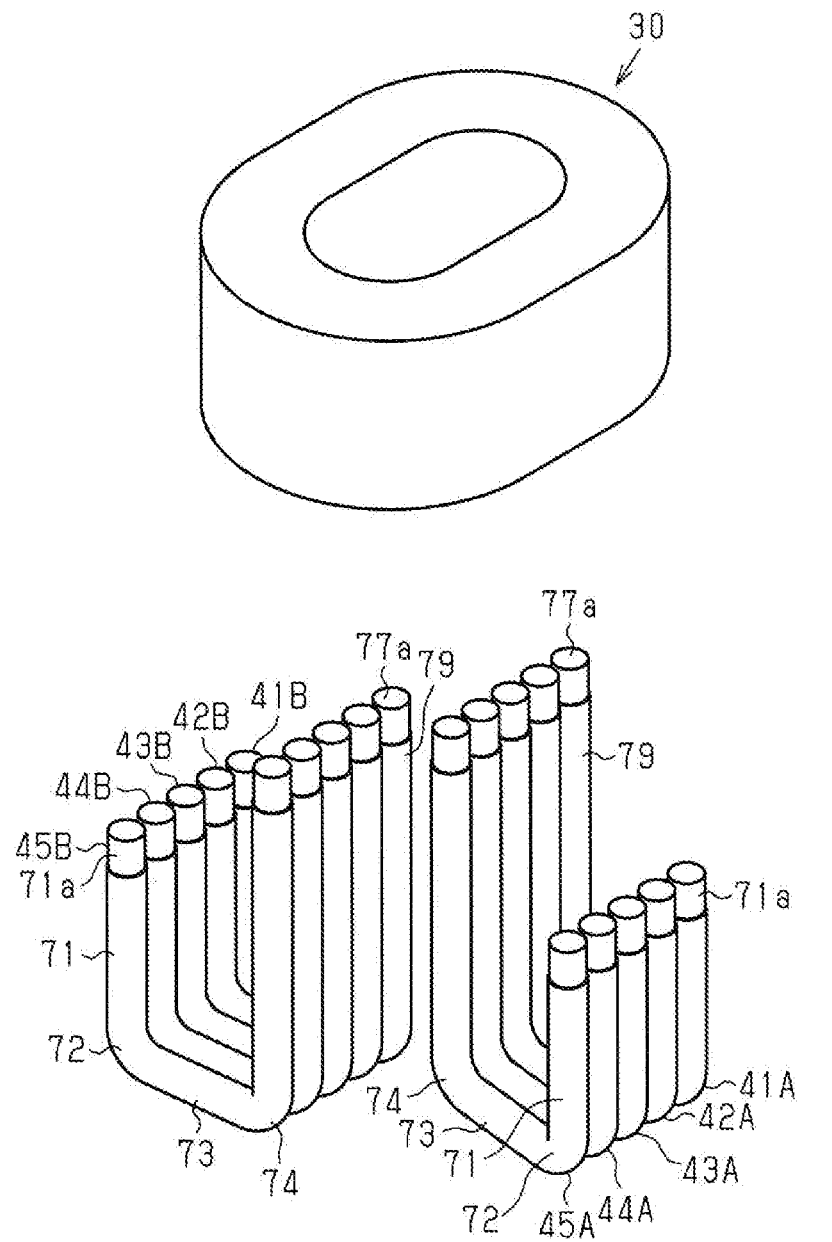
FIG. 23 is an exploded perspective view illustrating a core and first to fifth coil pieces in the inductor according to the fifth embodiment.

As illustrated in FIGS. 22 and 23, each of the first to fifth coil pieces 41A to 45A and 41B to 45B has an external straight portion 71, a first curved portion 72, a first straight portion 73, a second curved portion 74, an internal straight portion 75, a third curved portion 76, and a second straight portion 77. The first curved portion 72 is at the outside of the core 30, and the second curved portion 74 is at the inside of the core 30. As illustrated in FIG. 22, a weld section 78 is formed between a joint surface 77a of the second straight portion 77 and a joint portion 71a of the external straight portion 71 by laser welding as in the first embodiment. While only the joint section between the joint portion 71a of the second coil piece 42A and the joint surface 77a of the third coil piece 43A and the joint section between the joint portion 71a of the fourth coil piece 44B and the joint surface 77a of the fifth coil piece 45B are denoted by the reference number "78" in FIG. 22 for the sake of convenience, the weld section 78 is also formed at each of the other joint sections.

As described above, the weld sections 78 are located outside of the core 30 from the external surface 30d of the core 30. In addition, the connection pieces 48A and 48B connect the external straight portions 71 of the fifth coil pieces 45A and 45B and the second electrode members 47A and 47B, respectively. Therefore, the connection pieces 48A and 48B are also located outside of the core 30. The connection pieces 48A and 48B in the present embodiment are shorter than the connection pieces 48A and 48B in the first embodiment.

As illustrated in FIG. 23, each of the first to fifth coil pieces 41A to 45A and 41B to 45B to which the coil piece bending step has not been performed has the third straight portion 79 disposed at the inner circumferential side of the core 30. The third straight portion 79 is bent as illustrated in FIGS. 24A and 24B.

Figure 24A:
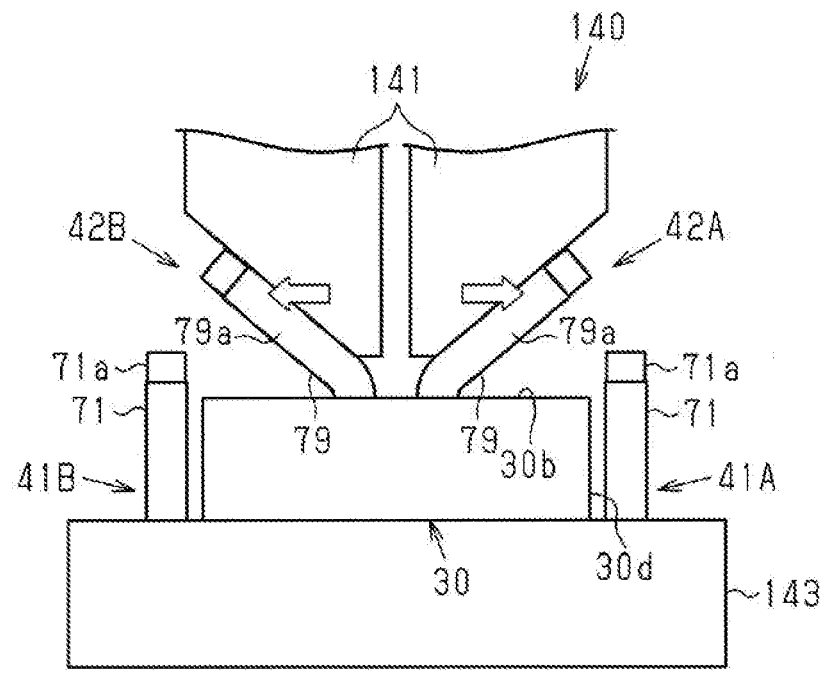
FIGS. 24A and 24B are explanatory views illustrating the method for manufacturing the inductor.
Figure 24B:
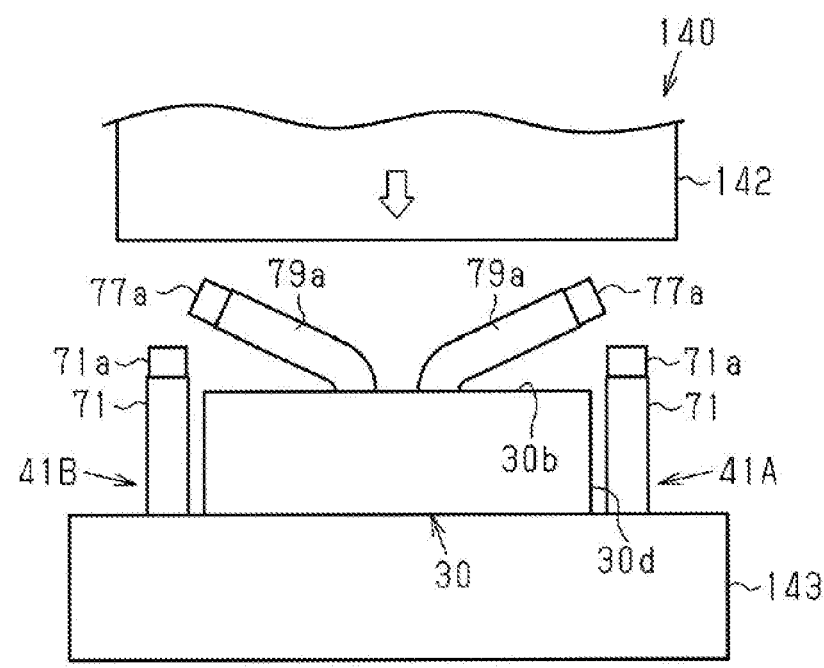

FIGS. 24A and 24B illustrate the coil piece bending step. That is, FIGS. 24A and 24B illustrate the bending step of the third straight portions 79 (projecting portions 79a) of the second coil pieces 42A and 42B. As illustrated in FIG. 24A, a jig (not illustrated) that holds the core 30 and the first to fifth coil pieces 41A to 45A and 41B to 45B (see FIG. 23) is placed on a lower die 143 of a pressing machine 140. Then, the projecting portions 79a of the second coil pieces 42A and 42B are bent outward by a first upper die 141. Then, as illustrated in FIG. 24B, the projecting portions 79a of the second coil pieces 42A and 42B are bent to be close to the second end surface 30b of the core 30 by the second upper die 142, and the joint surfaces 77a of the second coil pieces 42A and 42B are in contact with the joint portions 71a of the external straight portions 71 of the first coil pieces 41A and 41B. In this way, the joint surfaces 77a of the second coil pieces 42A and 42B are in contact with the joint portions 71a of the first coil pieces 41A and 41B by bending the projecting portions 79a of the second coil pieces 42A and 42B toward the external surface 30d of the core 30. The projecting portions 79a of the first coil pieces 41A and 41B and the third to fifth coil pieces 43A to 45A and 43B to 45B are also bent in the same manner as the projecting portions 79a of the second coil pieces 42A and 42B.

As described above, the present embodiment provides the following effects in addition to the effects based on the effects other than (1-3) of the first embodiment.

(5-1) In the inductor 1, a space around the external surface 30d of the core 30 is larger than a space around the internal surface 30c. Therefore, regarding the joint surfaces 77a and the joint portions 71a arranged in the circumferential direction of the core 30, the insulation distance between the adjacent joint surfaces 77a in the circumferential direction of the core 30 and the insulation distance between the adjacent joint portions 71a in the circumferential direction of the core 30 can be increased respectively.

(5-2) The respective electrode members 46A, 46B, 47A, and 47B are disposed at four corners of the case 10, and thus, a dead space in the case 10 where the core 30 and the first to fifth coil pieces 41A to 45A and 41B to 45B are not disposed can effectively be used. Accordingly, the inductor 1 can be downsized.

(Modifications)

The description regarding the respective embodiments shows examples of modes applicable to the inductor and the method for manufacturing the inductor according to the present disclosure, and is not intended to limit the modes. For example, the modifications of the above-mentioned respective embodiments described below and a mode obtained by combining at least two modifications consistent with each other are applicable to the inductor and the manufacturing method of the inductor according to the present disclosure.

The fitting structure used between the joint surfaces 57a and the side surfaces of the joint portions 51a of the first to fifth coil pieces 41A to 45A and 41B to 45B in the second embodiment may be applied to the inductor 1 according to the fifth embodiment.

The method for manufacturing the inductor according to the third embodiment may be applied to the second embodiment and the fifth embodiment. When the method for manufacturing the inductor according to the third embodiment is applied to the fifth embodiment, the support jig 130 covers the inner peripheral part including the inner peripheral end of the second end surface 30b of the core 30 and the end of the internal surface 30c near the second end surface 30b.

The insulating material 60 in the fourth embodiment may be applied to the second embodiment and the fifth embodiment. When the insulating material 60 is applied to the fifth embodiment, the insulating material 60 covers the inner peripheral part including the inner peripheral end of the second end surface 30b of the core 30 and the end of the internal surface 30c near the second end surface 30b.

In the second embodiment, the fitting structure between the joint surface 57a and the joint portion 51a can be modified as appropriate. This fitting structure may be modified to a structure illustrated in FIGS. 25A to 25C, for example. While FIGS. 25A to 25C illustrate the fitting structure between the first coil piece 41A and the second coil piece 42A, the fitting structures between the joint surfaces and the joint portions of the other coil pieces can be also similarly modified.

Figure 25A:
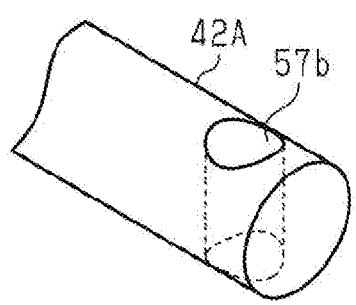
FIGS. 25A to 25C are partially perspective views illustrating first and second coil pieces of an inductor according to modifications.

As illustrated in FIG. 25A, a through-hole 57b having a circular opening is formed at the end opposite to the joint portion 51a of the second coil piece 42A. The inner diameter of the through-hole 57b is slightly smaller than the outer diameter of a joint portion 51d of the first coil piece 41A. The joint portion 51d is press-fitted to the through-hole 57b. That is, the through-hole 57b and the joint portion 51d are joined by an interference fit structure. In this case, the inner circumferential surface of the through-hole 57b serves as a joint surface fitted to the side surface of the joint portion 51d. Further, the diameter or the like of the through-hole 57b is set such that the area of the inner circumferential surface is larger than the average sectional area of the main body part 51b of the second coil piece 42A. Due to the through-hole 57b and the joint portion 51d being joined by the interference fit structure as described above, the inner circumferential surface of the through-hole 57b and the side surface of the joint portion 51d are reliably in contact with each other throughout the entire circumference. The side surface of the joint portion 51d and the inner circumferential surface of the through-hole 57b are not separated from each other by applying such an interference fit structure, which can prevent the first coil piece 41A and the second coil piece 42A from being disjoined from each other during the manufacturing process. It is to be noted that the joint portion 51d may be fitted tightly to the through-hole 57b without using the above-mentioned interference fit structure for the connection between the through-hole 57b and the joint portion 51d.

In addition, the above-mentioned interference fit structure may be applied to the fitting structure between the joint surface 57a and the joint portion 51a in the second embodiment. In this case, the side surface of the joint portion 51a and the joint surface 57a may be fitted to each other with the curvature (curvature of the cylindrical surface) of the side surface of the joint portion 51a being set to be slightly larger than the curvature (curvature of the recessed cylindrical surface) of the joint surface 57a.

Figure 25B:
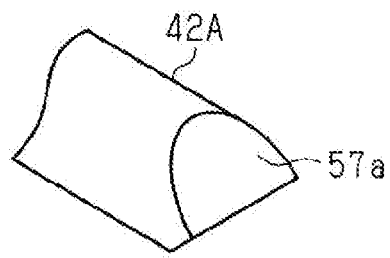
Figure 25B:
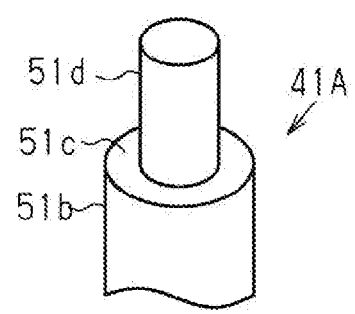
Figure 25B:
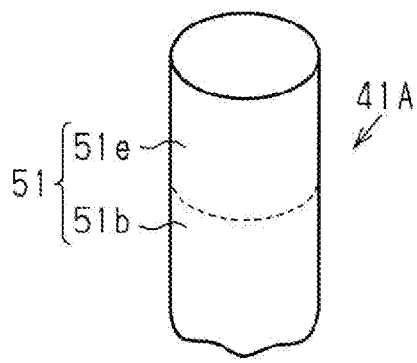
Figure 25C:
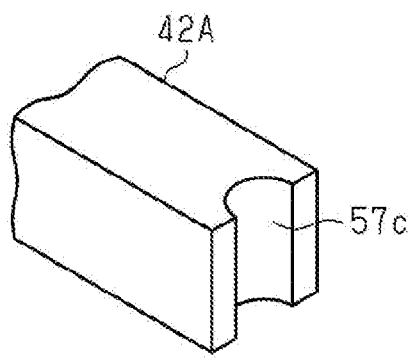
Figure 25C:
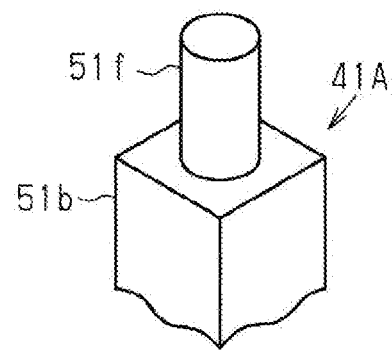

As illustrated in FIG. 25B, the outer diameter of a joint portion 51e of the first coil piece 41A may be set to be equal to the outer diameter of the main body part 51b. In this case, the recessed cylindrical surface of the joint surface 57a of the second coil piece 42A includes a portion having a circumferential length less than a half of the circumference of the side surface of the joint portion 51e.

As illustrated in FIG. 25C, a first coil piece 41A and a second coil piece 42A which are formed from a rectangular wire having a rectangular cross section may employ a fitting structure in which a cylindrical joint portion 51f of the first coil piece 41A and a recessed cylindrical joint surface 57c of the second coil piece 42A may be fitted to each other. The configuration of using a rectangular wire described above increases the average sectional areas of the first coil piece 41A and the second coil piece 42A, as compared to a configuration of using a round wire having a circular cross section. Thus, the resistance values of the first coil piece 41A and the second coil piece 42A can be reduced.

Figure 26A:
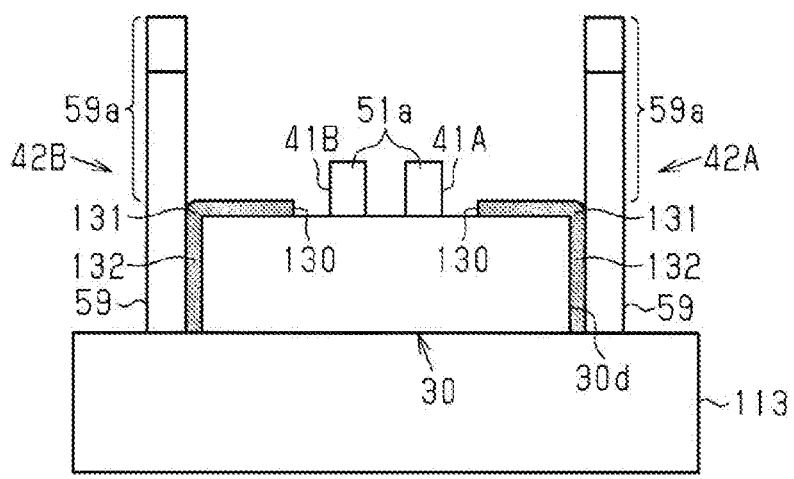
FIGS. 26A to 26C are explanatory views illustrating a method for manufacturing an inductor according to a modification.
Figure 26B:
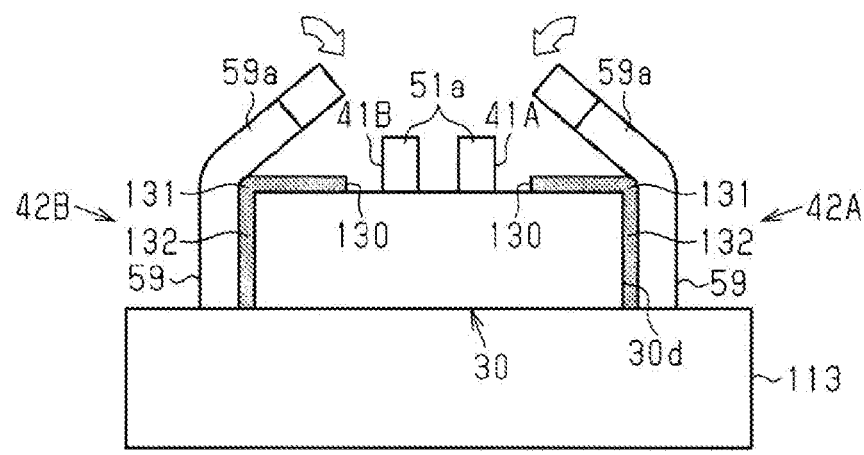
Figure 26C:
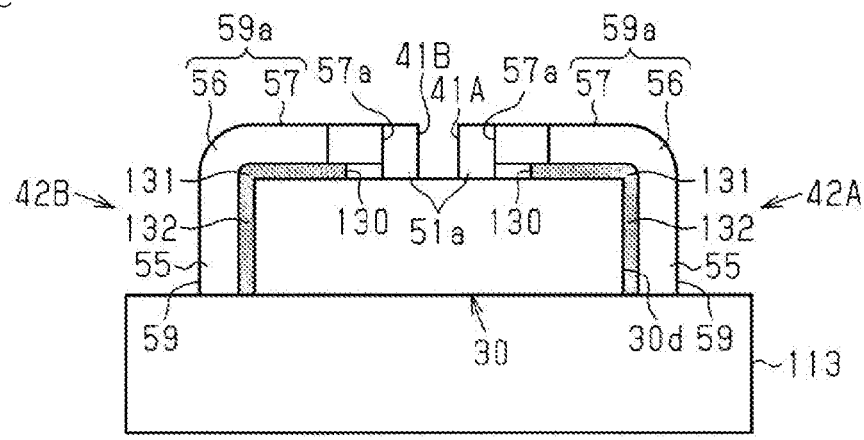

In the third embodiment, the support jig 130 may have an extension part 132 extending toward the first end surface 30a of the core 30 from the outer peripheral part 131 of the support jig 130 as illustrated in FIG. 26A. The extension parts 132 support the second curved portions 54 and the external straight portions 55 of the second coil pieces 42A and 42B. As illustrated in FIG. 26B, in the coil piece bending step, the projecting portions 59a of the second coil pieces 42A and 42B are bent, and after the joint surfaces 57a of the projecting portions 59a are in contact with the joint portions 51a of the first coil pieces 41A and 41B as illustrated in FIG. 26C, the support jigs 130 are pulled out. According to this configuration, as illustrated in FIG. 26B, the extension parts 132 support the third straight portions 59 when the projecting portions 59a are bent. Thus, this configuration can prevent a portion of the third straight portion 59 other than the projecting portion 59a from collapsing toward the external surface 30d of the core 30. Accordingly, the third curved portion 56 can easily be formed from the projecting portion 59a. The extension parts 132 of the support jigs 130 illustrated in FIG. 26A similarly support the third straight portions 59 when the projecting portions 59a of the first coil pieces 41A and 41B and the third to fifth coil pieces 43A to 45A and 43B to 45B are bent.

The configuration of the support jig according to the modification illustrated in FIGS. 26A to 26C may be applied to the configuration of the insulating material 60 in the fourth embodiment. That is, the insulating material 60 may have an extension part which covers the external surface 30d of the core 30 and extends toward the first end surface 30a.

In the fourth embodiment, two insulating materials 60 attached respectively to a pair of straight portions 31 of the core 30 may be integrated. According to this configuration, the step for attaching the insulating material 60 to the core 30 can be simplified, whereby the inductor 1 can easily be manufactured.

In each of the above embodiments, the jig 100 on which the first to fifth coil pieces 41A to 45A and 41B to 45B are placed may be configured to hold the internal straight portion 51 (75) and the external straight portion 55 (71) from their side. That is, the jig 100 according to the modification does not support the first straight portion 53 (73).

Figure 27A:
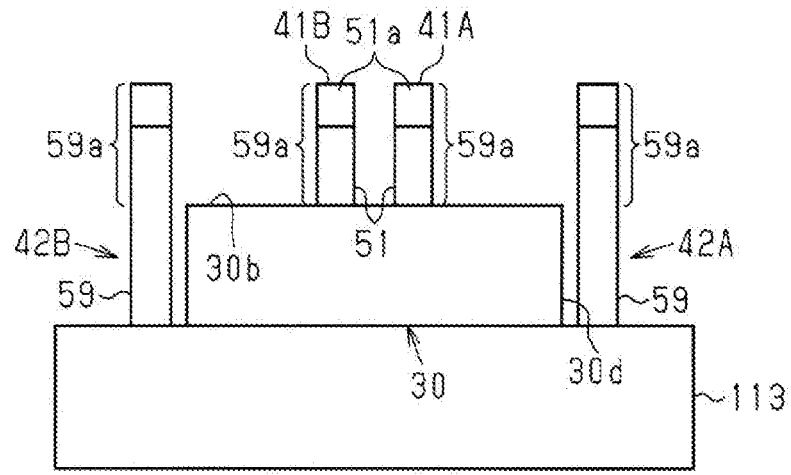
FIGS. 27A to 27C are explanatory views illustrating a method for manufacturing an inductor according to a modification.
Figure 27B:
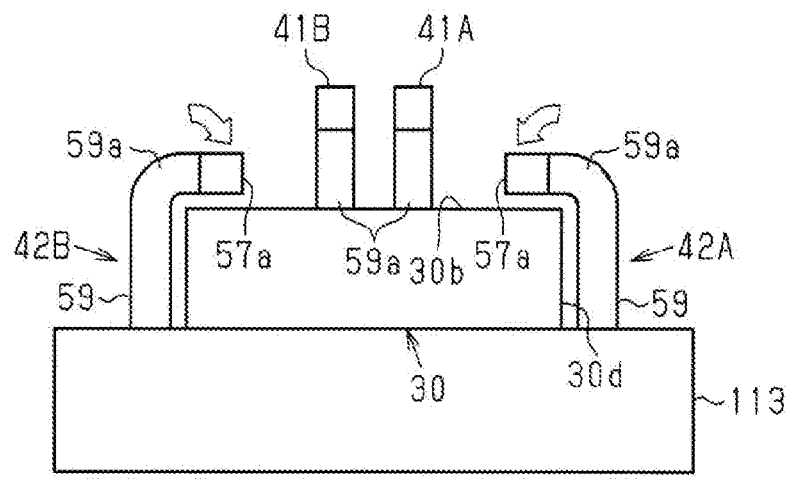
Figure 27C:
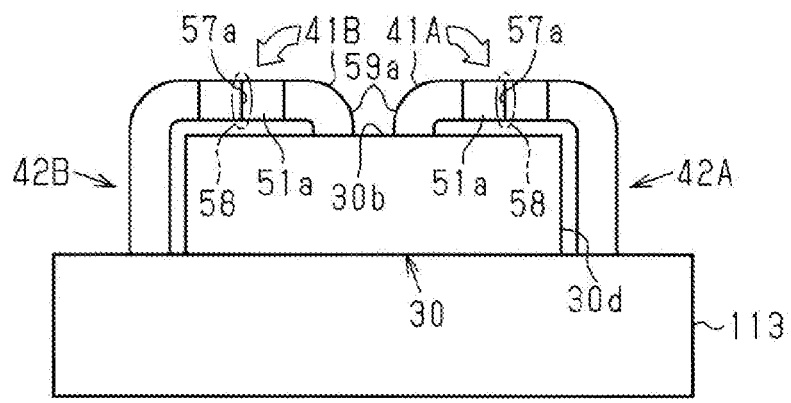

In the first to fourth embodiments, the projecting portion 59a may be formed on each of the first to fifth coil pieces 41A to 45A and 41B to 45B at both of a part at the inner circumferential side of the core 30 and a part at the outer circumferential side of the core 30, and these projecting portions 59a may be bent to enable contact between the joint surface 57a and the joint portion 51a. For example, as illustrated in FIG. 27A, the projecting portions 59a are formed respectively at the internal straight portions 51 of the first coil pieces 41A and 41B. The joint portion 51a is formed at the tip of the projecting portion 59a. As illustrated in FIG. 27B, the projecting portions 59a of the second coil pieces 42A and 42B are bent inward, and as illustrated in FIG. 27C, the projecting portions 59a of the internal straight portions 51 of the first coil pieces 41A and 41B are bent outward, whereby the joint surfaces 57a and the joint portions 51a are brought into contact with each other. With this process, the weld section 58 between the joint surface 57a and the joint portion 51a is at the center of the second end surface 30b of the core 30 in the width direction. According to this configuration, when the weld section 58 is formed by welding, heat accumulation at the corner between the second end surface 30b and the external surface 30d of the core 30 due to welding can be suppressed. Thus, deterioration in the performance of the core 30 can be suppressed. Notably, the first to fifth coil pieces 41A to 45A and 41B to 45B in the fifth embodiment can be also similarly modified.

In each of the above embodiments, the respective joint sections of the first to fifth coil pieces 41A to 45A and 41B to 45B, the electrode members 46A, 46B, 47A, and 47B, and the connection pieces 48A and 48B may be implemented by welding methods other than laser welding, such as resistance welding, diffusion welding, and ultrasonic welding.

Even if an interface which is likely to be generated by the above-mentioned joining between dissimilar metals is generated at the joint section, such an interface is allowed if the resistance loss of the inductor falls within a permissible range, and the joint sections of the first to fifth coil pieces 41A to 45A and 41B to 45B, the electrode members 46A, 46B, 47A, and 47B, and the connection pieces 48A and 48B may be implemented by a solder, for example. In this case, the weld section is formed from a solder.

While the first to fifth coil pieces 41A to 45A and 41B to 45B, the electrode members 46A, 46B, 47A, and 47B, and the connection pieces 48A and 48B are formed from the same metal material, they may be formed from different metal materials. In this case, it is preferable that metals having a small difference in physical properties are selected. For example, if laser welding is used for the joint section, metal materials having a small difference in thermal expansion coefficient, heat conductivity, and melting temperature are preferably selected, and if resistance welding is applied, metal materials having a small difference in resistivity besides the thermal expansion coefficient and heat conductivity are preferably selected.

Figure 28A:
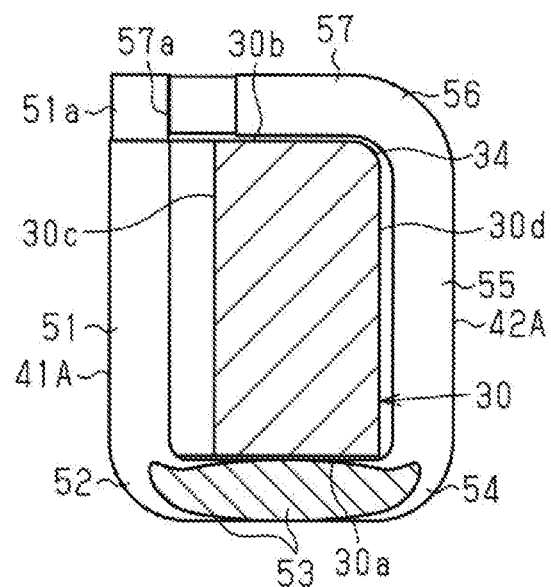
FIGS. 28A and 28B are schematic sectional views of an inductor according to modifications.
Figure 28B:
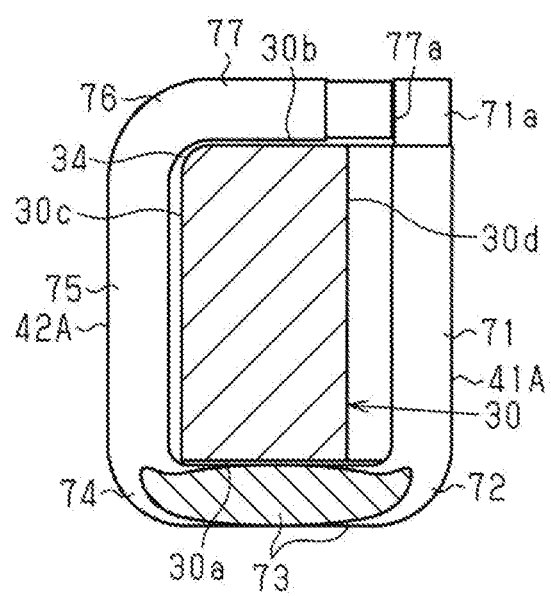

In each of the above embodiments, the shape of the core 30 can be modified as appropriate. For example, the annular shape of the core 30 in a plan view may be polygonal, elliptical, or circular. In addition, the cross-sectional shape of the core 30 along a plane perpendicular to the circumferential direction is not limited to be a rectangle, and may be a polygon other than the rectangle, an ellipse, or a circle. As one example, a curved surface 34 may be formed at a corner which is one of four corners of the core 30 in the cross section and corresponds to the third curved portion 56 (76) of each of the first to fifth coil pieces 41A to 45A and 41B to 45B. Specifically, as illustrated in FIG. 28A, when the third curved portion 56 is located outside of the core 30, the curved surface 34 is formed at the corner between the external surface 30d and the second end surface 30b of the core 30 in the cross section of the core 30. Further, as illustrated in FIG. 28B, when the third curved portion 76 is located inside of the core 30, the curved surface 34 is formed at the corner between the internal surface 30c and the second end surface 30b of the core 30 in the cross section of the core 30.

When the sectional shape of the core 30 along the plane perpendicular to the circumferential direction is polygonal, elliptical, or circular, the first to fifth coil pieces 41A to 45A and 41B to 45B preferably have a shape conforming to the sectional shape of the core 30.

In each of the above embodiments, the inductor 1 may have four ferrite bead cores. Two ferrite bead cores are attached to each of the first coil 40A and the second coil 40B. The ferrite bead core is formed into a cylinder having a center axis parallel to the center axis C of the core 30.

What is claimed is:

1. A method for manufacturing an inductor that includes an annular magnetic core and a coil wound around the magnetic core, the coil comprising a first coil piece and a second coil piece, the magnetic core has an internal surface, an external surface, a first end surface connecting the internal surface and the external surface, and a second end surface connecting the internal surface and the external surface and facing the first end surface, the method comprising:

disposing the first coil piece and the second coil piece around the magnetic core, the first coil piece and the second coil piece having a length of one turn wound around the magnetic core and having a shape capable of covering the internal surface, the external surface, and the first end surface of the magnetic core;

bending the second coil piece to cover the second end surface by a projecting portion of the second coil piece so as to allow a joint surface that is a tip surface of the second coil piece to be in direct contact with a joint portion of the first coil piece, the projecting portion projecting beyond the second end surface of the magnetic core along a center axis of the magnetic core; and forming at least a portion of the coil by joining the joint surface of the second coil piece and the joint portion of the first coil piece.

2. The method for manufacturing an inductor according to claim 1, wherein:

in the forming, the joint surface of the second coil piece and the joint portion of the first coil piece are joined by a weld section formed by melting the joint surface and the joint portion.

3. The method for manufacturing an inductor according to claim 2, wherein:

in the bending, the joint surface of the second coil piece is brought into contact with the joint portion of the first coil piece by bending the projecting portion of the second coil piece toward the joint portion of the first coil piece.

4. The method for manufacturing an inductor according to claim 2, wherein:

in the bending, the joint surface of the second coil piece is brought into contact with a side surface of the joint portion of the first coil piece by fitting the tip of the projecting portion of the second coil piece to the joint portion of the first coil piece.

5. The method for manufacturing an inductor according to claim 1, wherein:

in the bending, the joint surface of the second coil piece is brought into contact with the joint portion of the first coil piece by bending the projecting portion of the second coil piece toward the joint portion of the first coil piece.

6. The method for manufacturing an inductor according to claim 1, wherein:

in the bending, the joint surface of the second coil piece is brought into contact with a side surface of the joint portion of the first coil piece by fitting the tip of the projecting portion of the second coil piece to the joint portion of the first coil piece.

7. The method for manufacturing an inductor according to claim 6, wherein:
an area of the joint surface of the second coil piece is larger than an average sectional area of the second coil piece.

8. The method for manufacturing an inductor according to claim 6, wherein:
the first coil piece has a step portion formed at the joint portion, and
in the bending, the projecting portion of the second coil piece is bent and fitted to the joint portion of the first coil piece such that the projecting portion of the second coil piece is in contact with the step portion of the first coil piece.

9. The method for manufacturing an inductor according to claim 6, wherein:
the joint portion of the first coil piece is cylindrical, and
the joint surface of the second coil piece has a recessed cylindrical surface provided at the tip of the projecting portion of the second coil piece and fitted to the joint portion of the first coil piece.

10. The method for manufacturing an inductor according to claim 1, wherein:
in the bending, an insulating material having electrical insulating properties is attached to the magnetic core, and the insulating material is sandwiched between the projecting portion of the second coil piece and the magnetic core by bending the projecting portion of the second coil piece.

11. The method for manufacturing an inductor according to claim 1, wherein:
in the bending, a support jig for supporting the projecting portion of the second coil piece is attached to the magnetic core, and after the projecting portion of the second coil piece is bent, the support jig sandwiched between the projecting portion of the second coil piece and the magnetic core is pulled out.

12. The method for manufacturing an inductor according to claim 1, wherein:
in the disposing, the projecting portion of the second coil piece is disposed at the side near the external surface of the magnetic core, and the joint portion of the first coil piece is disposed at the side near the internal surface of the magnetic core, and
in the bending, the projecting portion of the second coil piece is bent toward the internal surface to bring the joint surface of the second coil piece to be in contact with the joint portion of the first coil piece.

13. The method for manufacturing an inductor according to claim 1, wherein:
in the disposing, the projecting portion of the second coil piece is disposed at the side near the internal surface of the magnetic core, and the joint portion of the first coil piece is disposed at the side near the external surface of the magnetic core, and
in the bending, the projecting portion of the second coil piece is bent toward the external surface to bring the joint surface of the second coil piece to be in contact with the joint portion of the first coil piece.

14. The method for manufacturing according to claim 1, wherein the joint surface is an endmost surface of the second coil piece.

15. A method for manufacturing an inductor that includes an annular magnetic core and a coil wound around the magnetic core, the coil comprising a first coil piece and a second coil piece, the magnetic core has an internal surface, an external surface, a first end surface connecting the internal surface and the external surface, and a second end surface connecting the internal surface and the external surface and facing the first end surface, the method comprising:
disposing the first coil piece and the second coil piece around the magnetic core, the first coil piece and the second coil piece having a length of one turn wound around the magnetic core and having a shape capable of covering the internal surface, the external surface, and the first end surface of the magnetic core;
bending the second coil piece to cover the second end surface by a projecting portion of the second coil piece so as to allow a joint surface that is an end-surface of the second coil piece to be in direct contact with a joint portion of the first coil piece, the projecting portion projecting beyond the second end surface of the magnetic core along a center axis of the magnetic core; and
forming at least a portion of the coil by joining the joint surface of the second coil piece and the joint portion of the first coil piece,
wherein an end portion of the second coil piece is located perpendicular to an end portion of the first coil piece.

* * * * *